(12) United States Patent
Maekawa et al.

(10) Patent No.: US 8,263,983 B2
(45) Date of Patent: Sep. 11, 2012

(54) WIRING SUBSTRATE AND SEMICONDUCTOR DEVICE

(75) Inventors: Shinji Maekawa, Kanagawa (JP); Yasuyuki Arai, Kanagawa (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 0 days.

(21) Appl. No.: 10/973,986

(22) Filed: Oct. 27, 2004

(65) Prior Publication Data
US 2005/0121675 A1 Jun. 9, 2005

(30) Foreign Application Priority Data
Oct. 28, 2003 (JP) ................................ 2003-367163

(51) Int. Cl.
*H01L 29/04* (2006.01)
*H01L 29/76* (2006.01)
(52) U.S. Cl. .............................. 257/72; 257/66; 257/347
(58) Field of Classification Search .................. 257/72, 257/57, 59, 66, 347
See application file for complete search history.

(56) References Cited

U.S. PATENT DOCUMENTS

| | | | | |
|---|---|---|---|---|
| 5,561,318 A * | 10/1996 | Gnade et al. | ................... | 257/638 |
| 5,661,344 A * | 8/1997 | Havemann et al. | ............ | 257/758 |
| 6,160,270 A * | 12/2000 | Holmberg et al. | ............. | 257/59 |
| 6,380,046 B1 * | 4/2002 | Yamazaki | ..................... | 438/409 |
| 6,429,035 B2 * | 8/2002 | Nakagawa et al. | ............. | 438/57 |
| 6,429,053 B1 * | 8/2002 | Yamazaki et al. | ............. | 438/149 |
| 6,707,513 B2 | 3/2004 | Tsujimura et al. | | |
| 6,791,144 B1 | 9/2004 | Fryer et al. | | |
| 6,859,252 B2 | 2/2005 | Tsujimura et al. | | |
| 6,984,892 B2 * | 1/2006 | Gotkis et al. | .................... | 257/758 |
| 6,995,753 B2 * | 2/2006 | Yamazaki et al. | ............. | 345/204 |
| 7,037,769 B2 | 5/2006 | Fryer et al. | | |
| 7,045,469 B2 * | 5/2006 | Sohn et al. | ...................... | 438/758 |
| 7,057,287 B2 * | 6/2006 | Kumar et al. | .................. | 257/758 |
| 7,356,921 B2 | 4/2008 | Furusawa et al. | | |
| 7,622,375 B2 | 11/2009 | Kisu et al. | | |
| 2001/0055830 A1 * | 12/2001 | Yoshimoto | ....................... | 438/48 |
| 2002/0106861 A1 * | 8/2002 | Yamazaki | ...................... | 438/308 |
| 2003/0083203 A1 | 5/2003 | Hashimoto et al. | | |

(Continued)

FOREIGN PATENT DOCUMENTS
JP 11-274681 10/1999
(Continued)

OTHER PUBLICATIONS

E.M. Zielinski et al., "Damascene Integration of Copper and Ultra-Low-k Xerogel for High Performance Interconnects," IEEE, 1997, 3 pages.

(Continued)

*Primary Examiner* — Ori Nadav
(74) *Attorney, Agent, or Firm* — Nixon Peabody LLP; Jeffrey L. Costellia

(57) ABSTRACT

The present invention provides a thin wiring pattern such as wiring formed by discharging a droplet. In the present invention, a porous (including microporous) substance is formed as a base film in forming pattern by using a droplet discharge method (also referred to as an ink-jetting method). One feature of a wiring substrate according to the present invention provides a porous film and a conductive layer thereon. One feature of a semiconductor device of the present invention provides a thin film transistor in which a gate electrode is formed by the conductive layer having the above-described structure.

6 Claims, 16 Drawing Sheets

U.S. PATENT DOCUMENTS

| | | |
|---|---|---|
| 2003/0214042 A1* | 11/2003 | Miyazawa .................... 257/758 |
| 2004/0130032 A1* | 7/2004 | Gronbeck et al. ............ 257/759 |
| 2004/0145692 A1 | 7/2004 | Yamazaki et al. |
| 2004/0147066 A1 | 7/2004 | Yamazaki et al. |
| 2004/0147113 A1 | 7/2004 | Yamazaki et al. |
| 2004/0263564 A1 | 12/2004 | Mackawa et al. |
| 2005/0012151 A1 | 1/2005 | Yamaguchi et al. |
| 2005/0072974 A1 | 4/2005 | Nakamura et al. |
| 2005/0122351 A1 | 6/2005 | Yamazaki et al. |

FOREIGN PATENT DOCUMENTS

| | | |
|---|---|---|
| JP | 11-317157 | 11/1999 |
| JP | 2002-043575 | 2/2002 |
| JP | 2002-076366 | 3/2002 |
| JP | 2002-303716 | 10/2002 |
| JP | 2003-133691 | 5/2003 |
| JP | 2003-229579 | 8/2003 |
| JP | 2003-243327 | 8/2003 |
| JP | 2003-257890 | 9/2003 |
| JP | 2003-264068 | 9/2003 |
| JP | 2003-273216 | 9/2003 |
| JP | 2003-303880 | 10/2003 |
| JP | 2004-006290 | 1/2004 |
| JP | 2004-006578 | 1/2004 |
| WO | WO 03/083172 A1 | 10/2003 |

OTHER PUBLICATIONS

John A. Rogers et al., "Acoustic waveguide properties of a thin film of nanoporous silica on silicon," Applied Physics Letters, vol. 75, No. 6, Aug. 1999, pp. 865-867.

Yuhuan Xu et al., "Dielectric property and microstructure of a porous polymer material with ultralow dielectric constant," Applied Physics Letters, vol. 75, No. 6, Aug. 1999, pp. 853-855.

* cited by examiner

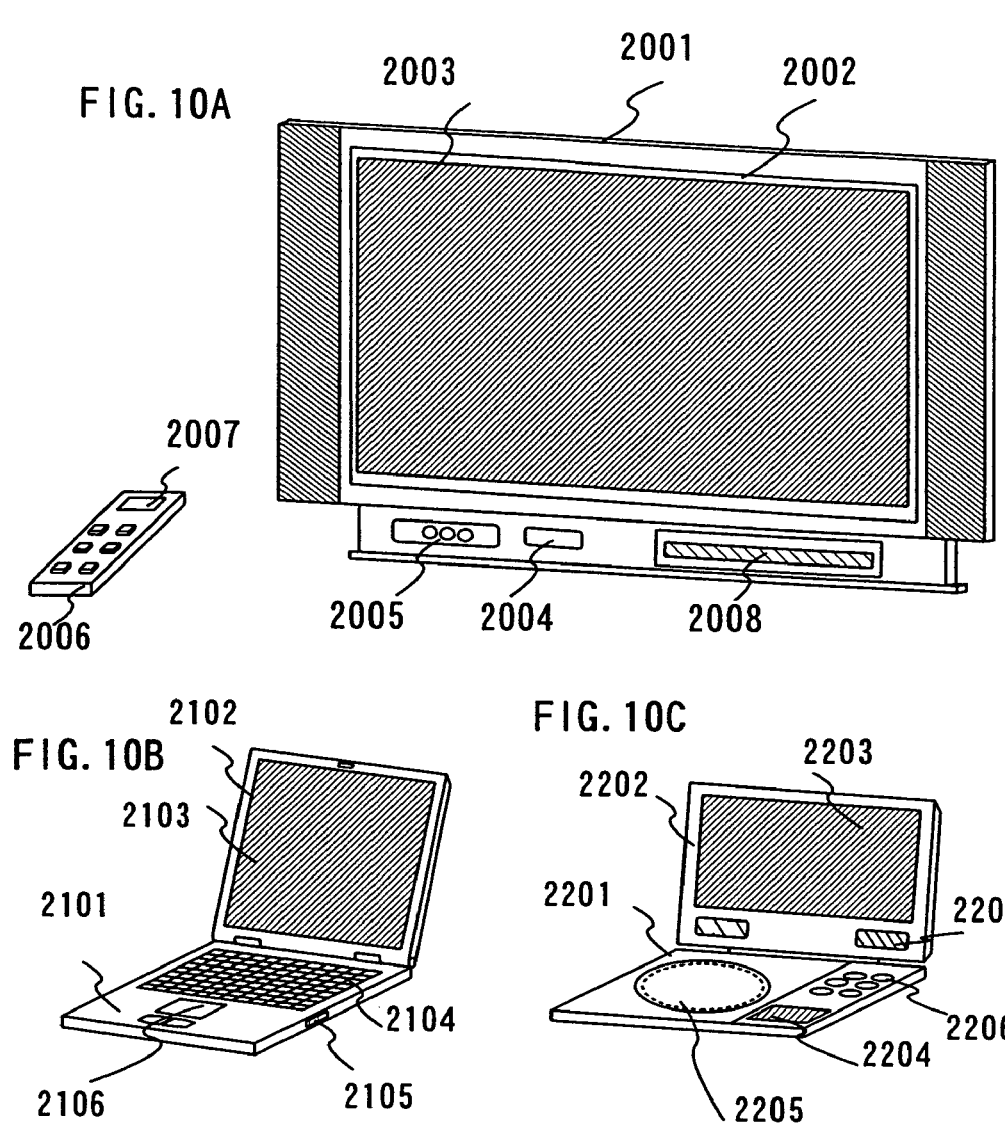
FIG. 10A
FIG. 10B
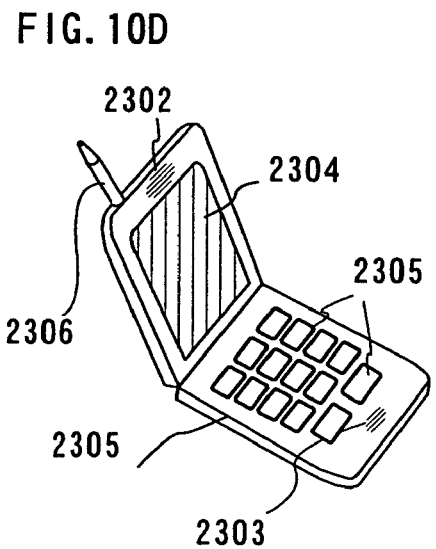
FIG. 10C
FIG. 10D
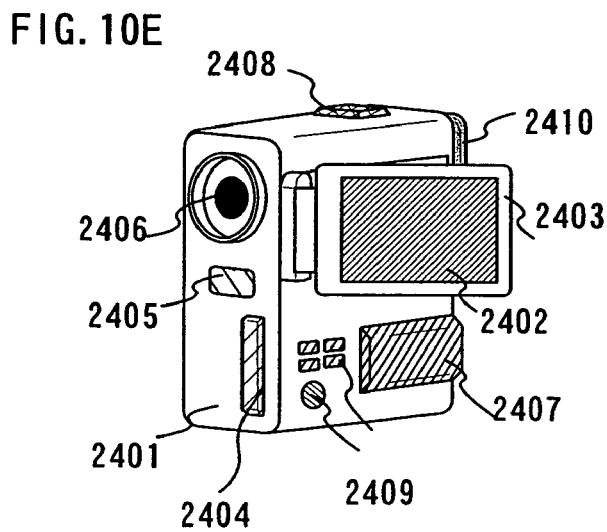
FIG. 10E

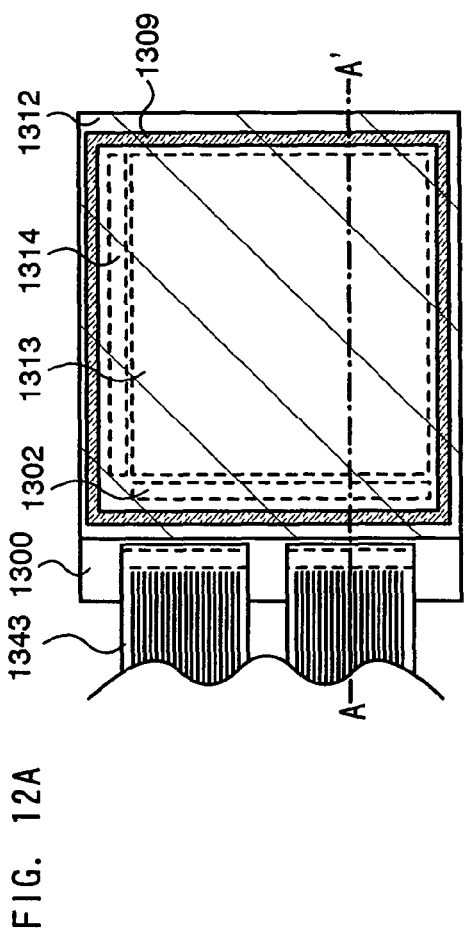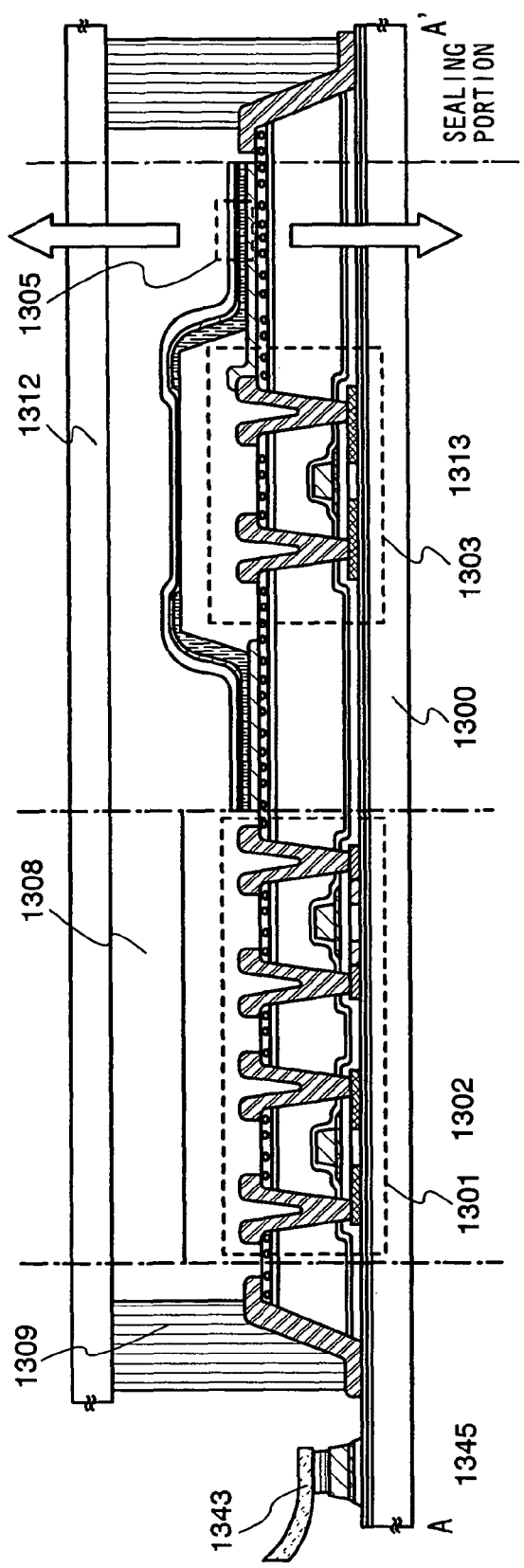
FIG. 12A
FIG. 12B

WIRING SUBSTRATE AND SEMICONDUCTOR DEVICE

BACKGROUND OF THE INVENTION

1. Field of the Invention

The present invention relates to a wiring substrate, a manufacturing method thereof using a droplet discharge method, a semiconductor device, and a manufacturing method thereof. Note that the semiconductor device of the present specification indicates devices in general that may perform by utilizing semiconductor properties. For example, a display device, an electro-optical device, a semiconductor circuit, and an electronic appliance are all semiconductor devices.

2. Description of the Related Art

In recent years, a droplet discharge method is applied to the field of a flat-panel display, and the development proceeds actively. The droplet discharge method has many advantages: for example, a mask is not required since a droplet can be directly applied, the method is easy to be applied to a large-scale substrate, and the material has high usability. Therefore, the droplet discharge method is applied to manufacturing a color filter, and an electrode of a plasma display, and the like.

In order to form a wiring to be thin, discharge amount is controlled and a base surface is treated in plasma, for example, during forming a pattern such as a wiring of an electric appliance by a droplet discharge method. (For example, refer to Patent Document 1: Japanese Patent Laid-Open No. 2003-133691.) Accordingly, forming the wiring of approximately 50 μm is possible.

In the field of electric appliances, it is expected to form a wiring having thinner width. For example, a technique to form a wiring having a width of about from 5 to 10 μm is required for a display panel.

However, a wiring cannot be sufficiently thinned by only the surface treatment of base surface that is performed in the conventional art. Moreover, by using the plasma treatment, the condition of the surface is modified temporarily, but the condition changes as time goes by. Therefore, there is a problem of repeatability in process.

SUMMARY OF THE INVENTION

In view of the foregoing, it is an object of the present invention to provide a technique that can form a minute wiring in forming a pattern such as a wiring by discharging a droplet.

To solve the above-mentioned problems in the conventional art, methods described hereinafter are employed in the present invention.

The present invention solves the above-mentioned problems by forming a film comprising a porous (including microporous) substance as a base film in forming a pattern by using a droplet discharge method (also referred to as an ink-jetting method).

The term "porous" means the property having a number of pores (holes), and a substance having a plurality of pores is called a porous substance. The porous substance is distinguished by a ratio of pores in the substance (porosity), distribution of a pore size, and the shape of a pore. The pore size is different depending on substance, and a pore is classified into three types: micropore having a size of 2 nm or less, mesopore having a size of from 2 to 50 nm, and macropore having a size of 50 nm or more. Moreover, a porous film has some types from microporous film to porous film depending on the porosity. However, in the present invention, any film that has pores and serves as keeping a substance (molecule, ion, and the like such as gas and liquid) can be used regardless of its porosity when a droplet soaks into the film. This type of film is called porous film.

The porous film is a film having holes inside, and by forming a porous film as a base film, a discharged droplet soaks into (is adsorbed to) the pores (holes) so that the pattern is prevented from spreading transversely. A discharged material goes into the porous film in several ways, for example, a way to go into pores in the porous film by gravity, or a way to adsorb the discharged material depend on the electric state of the surface of the porous film, or the like, but the present invention is not limited to the methods. Note that the present invention achieves thinning of a wiring by preventing a droplet from spreading transversely without remaining, in case that the droplet is discharged on an inorganic or organic film.

As the porous film, an organic porous material and an inorganic porous material may be used, and a porous material having a siloxane bond (for example, a porous material having a methylsiloxane-based polymer skeleton), a porous organic resin material as typified by porous silicon or porous polyimide, a porous silica material, and the like, can be applied. The porous silicon is a low-density silicon layer formed over a silicon surface by electrochemical treatment. As an inorganic porous material, other material such as a film comprising fine particles of aluminum oxide (also referred to as alumina), can be used. Moreover, as a material for a non-porous material, a porous spray film, an electrolytic oxidation film, a chemical conversion film, or a porous film formed to be porous by etching treatment and the like, may be used. Furthermore, the porous film having a thickness of from 0.05 to 1 μm can be used.

One embodiment of the present invention is a wiring substrate that has a porous film and a conductive layer formed on the porous film.

One embodiment of the present invention is a wiring substrate that has an insulating layer, a porous film over the insulating layer, and a conductive layer formed on the porous film.

One embodiment of the present invention is a wiring substrate that has a first insulating layer, a porous film over the first insulating layer, a conductive layer on the porous film, and a second insulating layer that covers the porous film and the conductive layer. Moreover, the second insulating layer can be formed by an oxide material or nitride material of silicon.

According to the above-mentioned structure, the porous film is formed as a base film of the conductive layer, and a portion of the porous film that is not in contact with the conductive layer may be etched. Therefore, the porous film and the conductive layer are laminated in the same region (pattern). Moreover, a conductive material discharged on the porous film goes into the pores of porous since the porous film includes pores. Therefore, a portion of pores is filled with the conductive material.

One embodiment of the present invention is a wiring substrate that has a first conductive layer, a porous film having an opening that reaches the first conductive layer, and a second conductive layer that is connected to the first conductive layer in the opening.

One embodiment of the present invention is a wiring substrate that has a first conductive layer, an insulating layer over the first conductive layer, a porous film over the insulating layer, the insulating layer and the porous film has a opening that reaches the first conductive layer, and a second conductive layer that is connected to the first conductive layer in the opening.

According to the above-mentioned structure, a conductive material discharged on the porous film to form the second conductive film goes into pores of porous since the porous film includes pores as described above. Therefore, a portion of pores is filled with the conductive material.

As a material for the porous film, an organic material, a porous material which has a skeleton formed by a bond of silicon and oxygen, a porous organic resin material, or a porous silica material, or the like can be used.

Moreover, the insulating layer is formed by an oxide material or a nitride material of silicon, since a dielectric constant of the thin film formed by using the above-mentioned material and the like are suitable for a gate insulating film.

Moreover, the insulating layer provided with the opening may be formed by an organic material or a material which has a skeleton formed by a bond of silicon and oxygen. The organic material is superior in planarity, so it is preferably because the film thickness does not extremely thin in an uneven portion, or breaking of wire does not happen in forming an electric conductor later. Moreover, the organic material has a low dielectric constant. Therefore, wiring capacity decreases and multilayer wiring can be formed by using the organic material as an interlayer insulator of a plurality of wirings, and high performance and high function can be realized.

On the other hand, as a material which has a skeleton formed by a bond of silicon and oxygen, a siloxane-based polymer can be given as a typical example. More specifically, a material, which has a skeleton formed by a bond of silicon and oxygen, and which includes at least hydrogen as a substituent or includes at least one selected from the group consisting of fluorine, alkyl group, or aromatic hydrocarbon as the substituent is used. The material is also superior in planarity, and has transparency and heat resistance, and heat treatment can be carried out at a temperature of approximately from 300 to 600° C. or less after forming an insulator comprising a siloxane polymer. According to the heat treatment, hydrogenation and baking treatment are carried out simultaneously. Moreover, one feature of the insulating layer provided with the opening is to have a thickness of from 100 nm to 2 µm, and this is because the insulating layer is provided with the opening that connects patterns of a lower layer and an upper layer.

The conductive layer, the first conductive layer, or the second conductive layer is formed by a composition including silver, gold, copper, or indium tin oxide. The particles of the materials can be processed into a nanometer size. Thus, by dispersing the particles into a solvent, drawing can be carried out easily by the droplet discharge method.

One embodiment of the present invention is a semiconductor device having a thin film transistor in which a gate electrode is formed by the conductive layer of the above-described structure. Moreover, one embodiment of the present invention is a semiconductor device having a thin film transistor in which a gate electrode is formed by the first conductive layer of the above-described structure and in which a source electrode or a drain electrode is formed by the second conductive layer of the above-described structure.

One embodiment of the present invention is a method for manufacturing a wiring substrate that has the steps of forming a porous film, and discharging a composition including a conductive material to form a conductive layer on the porous film.

One embodiment of the present invention is a method for manufacturing a wiring substrate that has the steps of forming an insulating layer, forming a porous film over the insulating layer, and discharging a composition including a conductive material to form a conductive layer on the porous film.

One embodiment of the present invention is a method for manufacturing a wiring substrate that has the steps of forming a first insulating layer forming, a porous film over the first insulating layer, discharging a composition including a conductive material to form a conductive layer on the porous film, and forming a second insulating layer that covers the porous film and the conductive layer.

One embodiment of the present invention is a method for manufacturing a wiring substrate that has the steps of forming a first conductive layer, forming a porous film over the first conductive layer, forming an opening that reaches the first conductive layer in the porous film, discharging a composition including a conductive material into the opening, and forming a second conductive layer to be in contact with the first conductive layer. The porous film also serves as an interlayer film, so a number of manufacturing steps do not increase, and the conductive layer can be formed to be thin.

One embodiment of the present invention is a method for manufacturing a wiring substrate that has the steps of forming a first conductive layer, forming an insulating layer over the first conductive layer, forming a porous film over the insulating layer, forming an opening that reaches the first conductive layer in the insulating layer and the porous film, discharging a composition including a conductive material in the opening, and forming a second conductive layer to be in contact with the first conductive layer.

According to the above-mentioned structure, a portion of the porous film that is not in contact with the conductive layer may be etched. Therefore, the porous film and the conductive layer are laminated in the same region and in the same pattern. However, in the case that the porous film is used as an interlayer film, the insulating layer may be formed to cover the porous film, with the porous film remained. Moreover, the porous film has pores, so a conductive material discharged over the porous film goes into (soak into) pores of the porous film. Some pores adsorbs the conductive material, and is filled with the conductive material. According to the present invention, the porous film serves as a base film of the conductive layer, and adsorbs a composition including the conductive material. Therefore, the conductive layer is prevented from spreading transversely and can be formed to be thin.

The conductive layer, the first conductive layer, or the second conductive layer can be formed by a composition including silver, gold, copper, or indium tin oxide. The particles of the materials can be processed into a nanometer size. Thus, by dispersing the particles into a solvent, drawing can be carried out easily by the droplet discharge method.

One embodiment of the present invention is a method for manufacturing a semiconductor device that has a step of forming a thin film transistor in which a gate electrode is formed by the conductive layer manufactured in the above steps. Moreover, a thin film transistor in which a gate electrode is formed by the first conductive layer manufactured in the above steps and in which a source electrode or a drain electrode is formed by the second conductive layer manufactured in the above steps is formed.

By forming a porous film as a base film, a discharged droplet soaks into the porous film, and a pattern is prevented from spreading transversely. Therefore, thinning of a wiring of a wiring substrate formed by the droplet discharge method, and a semiconductor device having a wiring by the droplet discharge method, and the like can be realized.

These and other objects, features and advantages of the present invention will become more apparent upon reading of the following detailed description along with the accompanied drawings.

BRIEF DESCRIPTION OF THE DRAWINGS

FIGS. 10A to 10E are views showing an electric appliance that the present invention is applied (Embodiment 5).

FIGS. 12A and 12B are top view and a cross-sectional view for a panel of one mode of a semiconductor device that the present invention is applied (Embodiment 2).

DETAILED DESCRIPTION OF THE INVENTION

Figure 1A:
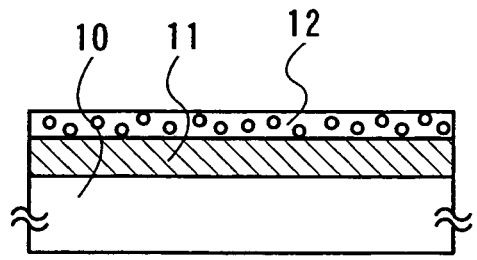
FIGS. 1A to 1D are explanatory views for a manufacturing method of a wiring substrate according to the present invention (Embodiment Mode 1).
Figure 1B:
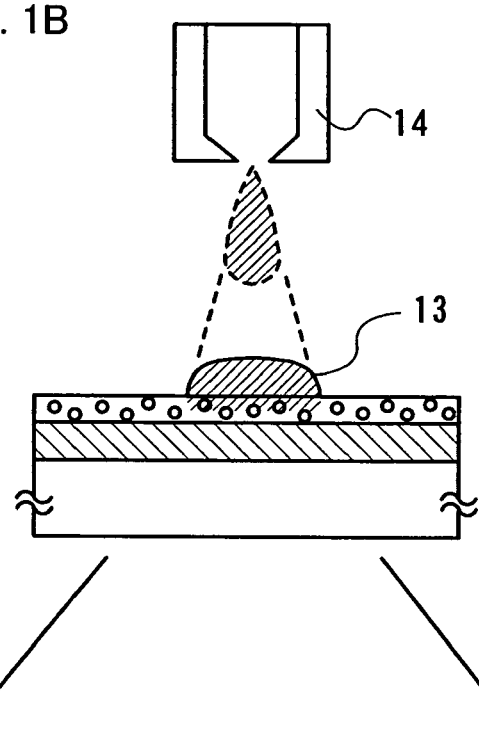

Embodiment modes according to the present invention are described in detail with reference to the drawings. It is easily understood by those who are skilled in the art that embodiments and details herein disclosed can be modified in various ways without departing from the scope and purpose of the present invention. Therefore, it should be noted that the description of embodiment modes to be given below should not be interpreted as limiting the present invention. Further, in constitutions according to the present invention to be described below, similar parts among different drawings are marked in common with the same reference numerals.

Embodiment Mode 1

An embodiment mode of the present invention is described with reference to FIGS. 1A to 1D. As a substrate 10, a glass substrate formed by barium borosilicate glass, alumino-borosilicate glass, or the like, a quartz substrate, a silicon substrate, a metal substrate, a stainless steel substrate, or a plastic substrate having heat resistance that can withstand the treatment temperature of the present manufacturing step is used (shown in FIG. 1A). Next, an insulating layer 11 is formed on the substrate 10. The insulating layer 11 is formed as a single layer or a laminated layer using an oxide material or a nitride material including silicon by a known method such as a CVD method, a plasma CVD method, a sputtering method, or a spin coating method. The insulating layer 11 is used as a base film, and there is an effect to block off contaminant and the like from the substrate 10, though the insulating layer is not necessarily formed.

Next, a porous film 12 is formed over the insulating layer 11. As the porous film, a porous material having a siloxane bond (for example, a porous material having a methylsiloxane-based polymer skeleton), a porous organic resin material as typified by porous polyimide, a porous silica material, and the like, can be applied. As a material for an inorganic porous material, other material such as a film comprising fine particles of aluminum oxide (also referred to as alumina), can be used. Moreover, as a material for the porous material having a siloxane bond, a material which includes at least hydrogen as a substituent or includes at least one selected from the group consisting of fluorine, alkyl group, or aromatic hydrocarbon as the substituent may be used.

The porous film having a siloxane bond may be formed by using a CVD method or a vapor deposition method, and an application method as typified by a spin coating method or a droplet discharge method may be also used. In the case where the porous film is formed by an application method, thinner pre-wet treatment is carried out to enhance wettability after washing with pure water Next, a liquid raw material called varnish in which the low molecular weight component (precursor) having a bond of silicon (Si) and oxygen (O) is dissolved in a solvent is applied to the substrate by a spin coating method or the like. After that, by heating the varnish with the substrate, both volatilization (evaporation) of the solvent and cross-linking reaction of the low molecular weight component are promoted to obtain a thin film. After that, a coating film formed on the periphery of an edge surface of the substrate is removed. In the case where the insulating layer (a bank) is formed, patterning may be carried out to obtain the desired shape. Moreover, the thickness of the film is controlled by the number of spin rotation, period of rotation, concentration and viscosity of the varnish. As the porous silica material, a porous silica film formed by forming a gel film with a mixed solution of TEOS (tetraethoxysilane), water, and ethanol and by thereafter volatilizing the solvent of the mixed solution may be used (shown in FIG. 1B).

Next, a conductive layer 13 is formed by discharging a composition including a conductive material. A droplet discharging means 14 is used to form the conductive layer 13. The droplet discharging means 14 is a generic term for what has a means of discharging a droplet, such as a nozzle having a discharge opening for the composition and a head provided with one or a plurality of nozzles. A diameter of the nozzle provided with the droplet discharging means 14 is set to be from 0.02 to 100 μm (preferably, 30 μm or less), and discharge amount of the composition discharged from the nozzle is set to be from 0.001 pl to 100 pl (preferably, 10 pl or less). The discharge amount increases in proportion to the diameter of the nozzle. In addition, the distance from the object to be processed to the discharge opening is preferably to be as close as possible to be discharged at the desired place. The distance is preferably set from 0.1 to 3 mm (more preferably, 1 mm or less).

Since the composition including the conductive material is discharged on the porous film 12 formed as a base film, the discharged droplet soaks so that the pattern is prevented from spreading transversely. Therefore, a minute wiring having a desired pattern can be formed.

As the composition discharged from the discharge opening, a compound that the conductive material is dissolved or dispersed in a solvent is used. The conductive material corresponds to fine particles or dispersion nanoparticles of metal such as Ag, Au, Cu, Ni, Pt, Pd, Ir, Rh, W, and Al, metal sulfide of Cd and Zn, oxide such as Fe, Ti, Si, Ge, Si, Zr, Ba, and silver halide. Moreover, the conductive material corresponds to indium tin oxide (ITO) used as a transparent conductive film, YSO formed by indium tin oxide and silicon oxide, organic indium, organic tin, zinc oxide, titanium nitride, or the like. However, as the composition discharged from the discharge opening, a composition in which any one material of Au, Ag, and Cu is dissolved or dispersed in a solvent is preferably used by considering a specific resistance value, and more preferably, Ag and Cu having low resistance may be used. However, in case of using Ag or Cu, it is preferably to provide with a barrier film as a measure against an impurity. As the solvent, esters such as butyl acetate and ethyl acetate, alcohols such as isopropyl alcohol and ethyl alcohol, or an organic solvent such as methyl ethyl ketone and acetone, or the like, is used. Viscosity of the composition is preferably 50 cp or less to prevent the composition from drying and to discharge the composition from the discharge opening smoothly. Moreover, the surface tension of the composition is preferably 40 mN/m or less. However, the viscosity of the composition and the like may be arbitrarily controlled in accordance with the solvent or the usage. As an example, viscosity is preferably set as follows; viscosity of a composition in which ITO, organic indium, organic tin or the like is dissolved or dispersed in a solvent is preferably set from 5 to 50 mPa·S, viscosity of a composition in which Ag is dissolved or dispersed in a solvent is preferably set from 5 to 20 mPa·S, and viscosity of a composition in which Au is dissolved or dispersed in a solvent is preferably set from 10 to 20 mPa·S.

The diameter of a particle of an electric conductor is preferably to be small as possible to prevent nozzle from clogging and to manufacture a pattern of high precision, and the grain diameter is preferably 0.1 μm or less, though it depends on the diameter of each nozzle, the desired shape of a pattern, and the like. The compound is formed by a known method such as an electrolytic method, an atomization method, or a wet reduction method, or the like, and the grain diameter is approximately from 0.01 to 10 μm in general. However, in the case where the particle of the electric conductor is formed by a gas evaporation method, a nanoparticle protected by a dispersing agent is as minute as approximately 7 nm, and in the case where each surface of the nanoparticle is covered with a coating agent, the nanoparticle is stably dispersed at room temperature without cohering in the solvent, and shows almost the same behavior as liquid. Therefore, the coating agent is preferably used.

As for a step of discharging the compound under reduced pressure, a subsequent step of drying and baking can be omitted, since the solvent of the composition is volatilized while the composition is discharged and reaches the object to be processed. In addition, it is preferably to carry out the step under reduced pressure, since an oxide film or the like is not formed on the surface of an electric conductor. Moreover, one or both steps of drying and baking are carried out after the composition is discharged. The drying step and the baking step are steps of heating treatment; however, the purpose, temperature, and time of the each step are different. For example, the drying step is carried out at a temperature of 100° C. for three minutes, and the baking step is carried out at a temperature of from 200 to 350° C. for from 15 to 60 minutes. The drying step and the baking step are carried out under normal pressure or reduced pressure by irradiation with laser light, rapid thermal annealing, and by using a heating furnace, and the like. Note that timing of carrying out the heat treatment is not particularly limited. To carry out the drying step and the baking step preferably, the substrate may be heated in advance, and the temperature at that time is generally set to be from 100 to 800° C. (preferably from 200 to 350° C.), though it depends on the material of the substrate and the like. According to the steps, nanoparticles are in contact with one another, and fusion and welding are accelerated by volatilizing a solvent in the composition or chemically eliminating the dispersing agent in order that resin in the periphery to cure and shrink.

A continuous oscillation or pulsed oscillation gas laser or solid state laser may be used for irradiation with laser light. An excimer laser, a YAG laser, or the like, can be given as the former gas laser, while lasers using crystals such as YAG or $YVO_4$ doped with Cr, Nd, or the like, can be given as the latter solid state laser. The continuous wave laser is preferably used in relation to the absorptance of laser light. Alternatively, a so-called hybrid laser irradiation method combining pulsed oscillation and continuous-wave oscillation may be employed. Note that heat treatment irradiation with the laser light may be instantaneously performed for several microseconds to several tens of seconds so as not to destroy the substrate 10 depending on heat resistance of the substrate 10. Rapid thermal annealing (RTA) is carried out by instantaneously heating the substrate for from several microseconds to several minutes while rapidly raising the temperature by using an infrared lamp, a halogen lamp, or the like, that emits ultraviolet light to infrared light in an inert gas atmosphere. This treatment is carried out instantaneously, and therefore, only the top surface of a thin film is substantially heated not to adversely influence underlying films. That is, a substrate that is weak in heat resistance such as a plastic substrate is not influenced by the heat treatment.

According to the above-described steps, the insulating layer 11, the porous film 12, and the conductive layer 13 are completed. Note that since the porous film 12 is used as a base film of the conductive layer 13 formed by the droplet discharge method, either of the two steps described hereinafter is carried out.

Figure 1C:
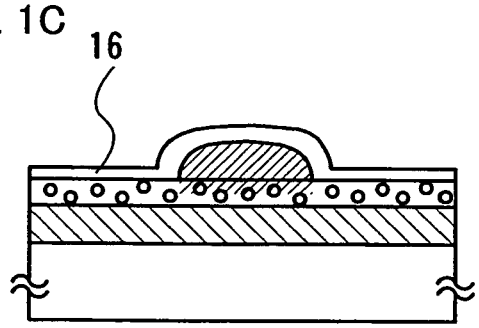

One step is a step for forming an insulating layer 16 as a protective film over the porous film 12 and the conductive layer 13 (shown in FIG. 1C). As a material for the insulating layer 16, a known material such as an oxide material or a nitride material of silicon may be used, but preferably, a silicon nitride film having fine film quality is used.

Figure 1D:
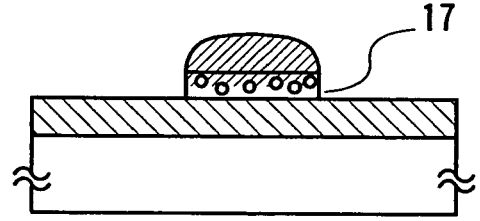

The other step is a step for forming a porous film 17 that the conductive layer 13 is used as a mask and the porous film 12 is etched (shown in FIG. 1D).

The conductive layer formed as described above may be used as a wiring, or may be used as one of the components of a thin film transistor by using the conductive layer 13 as a gate electrode, and by using the insulating layer 11 as a gate insulating film.

As described above, a conductive layer can be formed to be thin and to the desired pattern according to the present invention that the porous film 12 is formed as a base film of the conductive layer 13.

Embodiment Mode 2

An embodiment mode of the present invention is described with reference to FIGS. 2A to 2C. As a substrate 20, a glass substrate, a quartz substrate, or the like, are used. Next, an electric conductor (a conductor) or a semiconductor 21 is formed on the substrate 20. Here, the semiconductor 21 is illustrated. Note that a base film may be formed on the substrate 20 to prevent an impurity from penetrating from the substrate 20, if necessary.

Next, a porous film 22 is formed over the substrate 20. The porous film also serves as an interlayer film. The porous film 22 is formed to have a thickness of from 50 nm to 5 μm (preferably, from 100 nm to 2 μm) by using a known method such as a plasma CVD method, a sputtering method, a SOG (Spin On Glass) method, a spin coating method, and a droplet discharge method. As a material for the porous film, a porous material having a siloxane bond (for example, a porous material having a methylsiloxane-based polymer skeleton), a porous organic resin material as typified by porous polyimide, and a porous silica material, or the like, can be used. As a material for an inorganic porous material, other material such as a film comprising fine particles of aluminum oxide (also referred to as alumina), can be used. Moreover, as a material for the porous material having a siloxane bond, a material including at least hydrogen as a substituent, or a material having at least one of fluorine, alkyl group, or aromatic hydrocarbon as the substituent may be used.

The porous film having a siloxane bond may be formed by using a CVD method or a vapor deposition method, and an application method as typified by a spin coating method or a droplet discharge method may be used. In the case where the porous film is formed by an application method, thinner pre-wet treatment is carried out to enhance wettability after washing with pure water. Next, a liquid raw material called varnish in which the low molecular weight component (precursor) having a bond of silicon (Si) and oxygen (O) is dissolved in a solvent is applied to the substrate by a spin coating method or the like. After that, by heating the varnish with the substrate, both volatilization (evaporation) of the solvent and cross-linking reaction of the low molecular weight component are promoted to obtain a thin film. After that, a coating film formed on the periphery of an edge surface of the substrate is removed. In the case where the insulating layer (a bank) is formed, patterning may be carried out to obtain the desired shape. Moreover, the thickness of the film is controlled by the number of spin rotation, period of rotation, concentration and viscosity of the varnish. As the porous silica material, a porous silica film formed by forming a gel film with a mixed solution of TEOS (tetraethoxysilane), water, and ethanol and by thereafter volatilizing the solvent of the mixed solution may be used.

The organic material is superior in planarity, so it is preferably because the film thickness does not extremely thin in an uneven portion, or breaking of wire does not happen in forming an electric conductor later. Moreover, the organic material has a low dielectric constant. Therefore, wiring capacity decreases and multilayer wiring can be formed by using the organic material as an interlayer insulator of a plurality of wirings, and high performance and high function can be realized. Note that a thin film of an inorganic material including silicon may be formed on an upper layer and a lower layer of the organic material to prevent degassing. Specifically, a silicon nitride oxide film or a silicon nitride film may be formed by using a plasma CVD method or a sputtering method.

A siloxane-based polymer is given as a typical example of a material in which a skeletal structure is configured by a bond of silicon and oxygen and including at least hydrogen as a substituent or including at least one of fluorine, alkyl group, or aromatic hydrocarbon as the substituent, and various materials that is in a category of the condition described above can be used. The siloxane-based polymer is superior in planarity, and has transparency and heat resistance, and heat treatment can be carried out at a temperature of approximately from 300 to 600° C. or less after forming an insulator formed by the siloxane polymer. According to the heat treatment, hydrogenation and baking treatment, for example, can be carried out simultaneously.

Figure 2A:
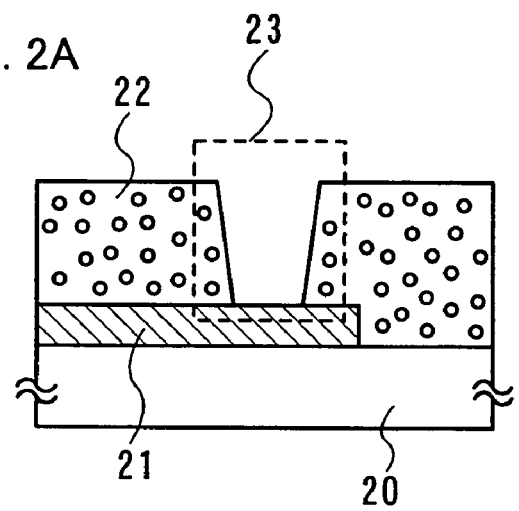
FIGS. 2A to 2C are explanatory views for a manufacturing method of a wiring substrate according to the present invention (Embodiment Mode 2).

Next, an opening (a contact hole) 23 is formed by patterning the porous film 22 by using photolithography (shown in FIG. 2A). Either wet etching or dry etching may be used, but the dry etching may be preferably used in case of forming a multiplayer wiring, since the opening 23 having a high aspect ratio (3 or more) can be formed by using the dry etching. Moreover, a mask employed for forming the opening 23 may be formed by using an organic material such as polyimide and acrylic with a droplet discharge method.

The opening 23 may be formed by not photolithography but a droplet discharge method. In the case of using the droplet discharge method, the opening is formed by discharging a wet etchant through a nozzle. Note that it is preferably that a step for arbitrarily washing with a solvent such as water is added to control the aspect ratio of the opening 23. Of course, in the case that the droplet discharge method is used and that droplet discharged through the nozzle is replaced with water or the head filled with the solvent is replaced, the washing step can be sequentially processed by using the same device, and is preferably from the viewpoint of reduction in processing time. By employing any one of the above-mentioned methods, the semiconductor 21 formed under the porous film 22 is exposed after the opening 23 is formed.

Figure 2B:
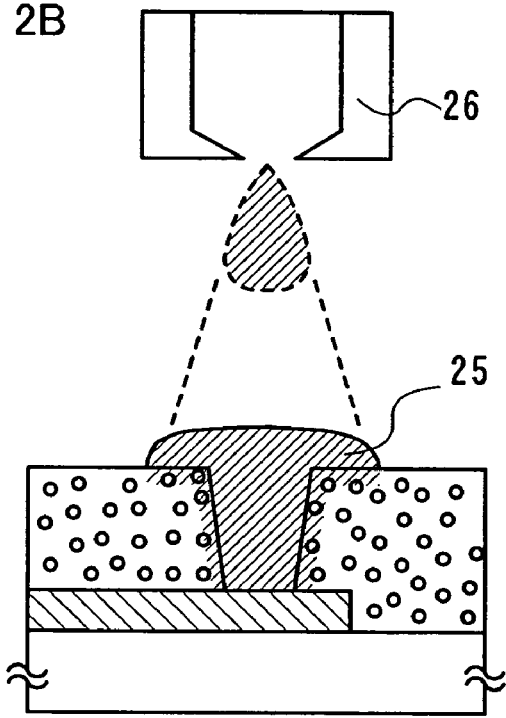

Next, a conductive layer 25 is formed by discharging a composition including a conductive material on the porous film 22 (shown in FIG. 2B). The conductive layer 25 is formed by using a droplet discharging means 26. Since the composition including the conductive material is discharged on the porous film 22 formed as a base film, the discharged droplet soaks into holes of the porous film so that the pattern is prevented from spreading transversely. Therefore, the conductive layer 25 can be formed in a desired pattern to be minute.

According to the above-described steps, the conductive layer 25 is completed.

Figure 2C:
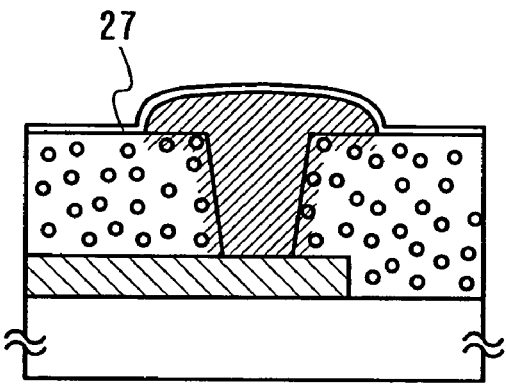

Next, an insulating layer 27 is formed as a protective film on the porous film 22 and the conductive layer 25 (shown in FIG. 2C). As a material for the insulating layer 27, a known material such an oxide material or a nitride material of silicon may be used, but preferably, a silicon nitride film having fine film quality is used.

The conductive layer formed as described above may be used as a wiring for connecting the upper layer and the lower layer of the conductive layer. Moreover, by laminating the conductive layer formed according to the present invention, a multilayer wiring can be formed. The multilayer wiring is preferably used for a functional circuit, which it is necessary to be provided with a number of semiconductor elements such as a CPU. The multilayer wiring makes the functional circuit high integrated to achieve drastic downsizing. Moreover, high-speed fabrication can be realized since the multilayer wiring is not necessary to be led out.

As described above, the conductive layer can be formed to be thin and to the desired pattern, according to the present invention that the porous film 22 is formed as a base film of the conductive layer 25. Moreover, the porous film 22 also serves as an interlayer film (a planarizing film) in this embodiment mode, so there is an effect that the number of steps do not increase. This embodiment mode can be freely combined with the above-described embodiment mode.

Embodiment Mode 3

An embodiment mode of the present invention is described with reference to FIGS. 6A to 6C. For a substrate 60, a glass substrate, a quartz substrate, or the like, is used (shown in FIG. 6A). Next, an electric conductor (a conductor) or a semiconductor 61 is formed on the substrate 60. Here, the semiconductor 61 is illustrated. Note that a base film may be formed on the substrate 60 to prevent an impurity from penetrating from the substrate 60, if necessary.

Next, an insulating layer 62 is formed as an interlayer film over the substrate 60. The insulating layer 62 is formed to have a thickness of from 50 nm to 5 μm (preferably, from 100 nm to 2 μm) by using a known method such as a plasma CVD method, a sputtering method, a SOG (Spin On Glass) method, a spin coating method, and a droplet discharge method.

An organic material is superior in planarity, so it is preferably because the film thickness does not extremely thin in an uneven portion, or breaking of wire does not happen in forming an electric conductor later. Moreover, an organic material has a low dielectric constant. Therefore, a wiring capacity decreases and a multilayer wiring can be formed by using as an interlayer insulator of a plurality of wirings, and high performance and high function can be realized. Note that a thin film of an inorganic material including silicon may be formed on an upper layer and a lower layer of the organic material to prevent degassing. Specifically, a silicon nitride oxide film or a silicon nitride film may be formed by using a plasma CVD method or a sputtering method.

A siloxane-based polymer is given as a typical example of a material in which a skeletal structure is configured by a bond of silicon and oxygen and including at least hydrogen as a substituent or including at least one of fluorine, alkyl group, or aromatic hydrocarbon as the substituent, and various materials that is in a category of the condition described above can be used. The siloxane-based polymer is superior in planarity, and has transparency and heat resistance, and heat treatment can be carried out at a temperature of approximately from 300 to 600° C. or less after forming an insulator formed by the siloxane polymer. According to the heat treatment, hydrogenation and baking treatment, for example, can be carried out simultaneously.

A porous film 64 is formed to have a thickness of approximately from 0.05 to 4 μm over the insulating layer 62. As a material for the porous film 64, a porous material having a siloxane bond (for example, a porous material having a methylsiloxane-based polymer skeleton), a porous organic resin material as typified by porous polyimide, a porous silica material, and the like, can be used. Moreover, as a material for the porous material having a siloxane bond, a material including at least hydrogen as a substituent, or a material having at least one of fluorine, alkyl group, or aromatic hydrocarbon as the substituent may be used.

The porous film having a siloxane bond may be formed by using a CVD method or a vapor deposition method, and an application method as typified by a spin coating method or a droplet discharge method may be also used. In the case where the porous film is formed by an application method, thinner pre-wet treatment is carried out to enhance wettability after washing with pure water. Next, a liquid raw material called varnish in which the low molecular weight component (precursor) having a bond of silicon (Si) and oxygen (O) is dissolved in a solvent is applied to the substrate by a spin coating method or the like. After that, by heating the varnish with the substrate, both volatilization (evaporation) of the solvent and cross-linking reaction of the low molecular weight component are promoted to obtain a thin film. After that, a coating film formed on the periphery of an edge surface of the substrate is removed. In the case where the insulating layer (a bank) is formed, patterning may be carried out to obtain the desired shape. Moreover, the thickness of the film is controlled by the number of spin rotation, period of rotation, concentration and viscosity of the varnish. As the porous silica material, a porous silica film formed by forming a gel film with a mixed solution of TEOS (tetraethoxysilane), water, and ethanol and by thereafter volatilizing the solvent of the mixed solution may be used.

Figure 6A:
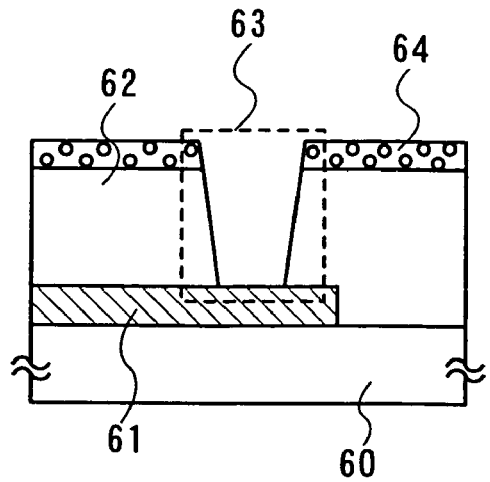
FIGS. 6A to 6C are explanatory views for a manufacturing method of a wiring substrate according to the present invention (Embodiment Mode 3).

Next, an opening (a contact hole) 63 is formed by patterning the insulating layer 62 and the porous film 64 by using photolithography (shown in FIG. 6A). Either wet etching or dry etching may be used to form the opening, but the dry etching may be preferably used in case of forming a multiplayer wiring, since the opening 63 having a high aspect ratio (3 or more) can be formed by using the dry etching. Moreover, a mask employed for forming the opening 63 may be formed by using an organic material such as polyimide and acrylic with a droplet discharge method.

The opening 63 may be formed by not photolithography but a droplet discharge method. In the case of using the droplet discharge method, the opening is formed by discharging a wet etchant through a nozzle. Note that it is preferably that a step for appropriately washing with a solvent such as water is added to control the aspect ratio of the opening 63. Of course, in the case that the droplet discharge method is used and that droplet discharged through the nozzle is replaced with water or the head filled with the solvent is replaced, the washing step can be sequentially processed by using the same device, and is preferably from the viewpoint of reduction in processing time. By employing any one of the above-mentioned methods, the semiconductor 61 formed under the porous film 62 is exposed after the opening 63 is formed.

Figure 6B:
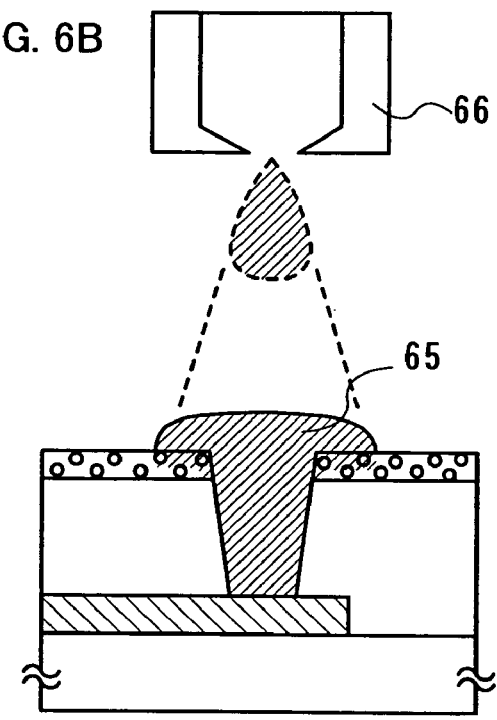

Next, a conductive layer 65 is formed by discharging a composition including a conductive material on the porous film 64 (shown in FIG. 6B). The conductive layer 65 is formed by using a droplet discharging means 66. Since the composition including the conductive material is discharged on the porous film 64 formed as a base film, the discharged droplet soaks into holes of the porous film so that the pattern is prevented from spreading transversely. Therefore, the conductive layer 65 can be formed into a desired pattern to be minute.

Figure 6C:
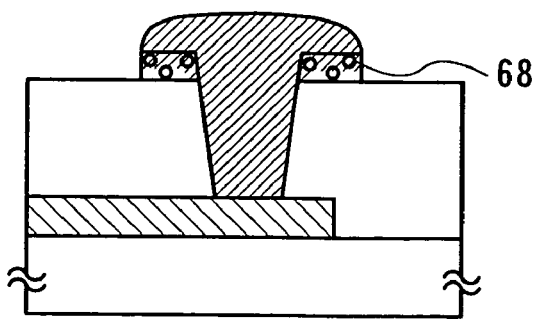

Next, a porous film 68 is formed by using the conductive layer 65 as a mask and etching the porous film 64 (shown in FIG. 6C).

The conductive layer formed as described above may be used as a wiring for connecting the upper layer and the lower layer of the conductive layer. Moreover, by laminating the conductive layer formed according to the present invention, a multilayer wiring can be formed. The multilayer wiring is preferably used for a functional circuit, which it is necessary to be provided with a number of semiconductor elements such as a CPU. The multilayer wiring makes a semiconductor element high integrated to achieve drastic downsizing. Moreover, high-speed fabrication can be realized since the multilayer wiring is not necessary to be led out.

As described above, the conductive layer can be formed to be thin and to the desired pattern, according to the present invention that the porous films 64 and 68 are formed as a base film of the conductive layer 65. This embodiment mode can be freely combined with the above-described embodiment mode.

Embodiment Mode 4

Figure 11A:
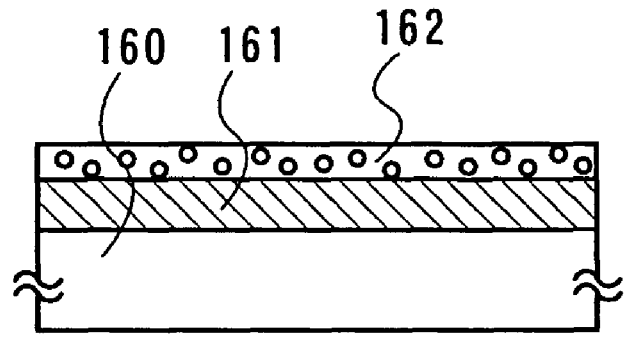
FIGS. 11A to 11C are explanatory views for a manufacturing method of a wiring substrate according to the present invention (Embodiment Mode 4).
Figure 11B:
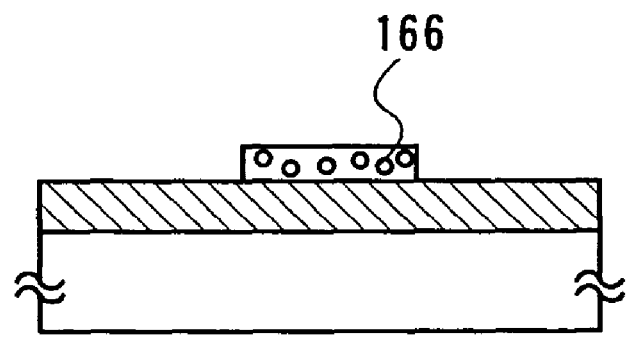

An embodiment mode of the present invention is described with reference to FIGS. 11A to 11C. As a substrate 160, a glass substrate formed by barium borosilicate glass, or alumino-borosilicate glass, or the like, a quartz substrate, a silicon substrate, a metal substrate, a stainless steel substrate, or a plastic substrate having heat resistance that can withstand the treatment temperature of the manufacturing step (shown in FIG. 11A). Next, an insulating layer 161 is formed over the substrate 160. The insulating layer 161 is formed as a single layer or a laminated layer using an oxide material or a nitride material including silicon by a known method such as a CVD method, a plasma CVD method, a sputtering method, or a spin coating method. The insulating layer 161 is used as a base film, and there is an effect to block off contaminant and the like from the substrate 160, though the insulating layer is not necessarily formed.

Next, a porous film 162 is formed over the insulating layer 161. As a material for the porous film, a porous material having a siloxane bond (for example, a porous material having a methylsiloxane-based polymer skeleton), a porous organic resin material as typified by porous polyimide, a porous silica material, and the like, can be used. As a material for an inorganic porous material, other materials such as a film comprising fine particles of aluminum oxide (also referred to as alumina), can be used. Moreover, as a material for the porous material having a siloxane bond, a material including at least hydrogen as a substituent, or a material including at least one of fluorine, alkyl group, and aromatic hydrocarbon as the substituent may be used.

The porous film having a siloxane bond may be formed by using a CVD method or a vapor deposition method, but an application method as typified by a spin coating method or a droplet discharge method may be used. In the case where the porous film is formed by a droplet discharge method, there is an effect that the process is simplified since patterning after forming the porous film can be omitted. In the case where the porous film is formed by an application method, thinner pre-wet treatment is carried out to enhance wettability after washing with pure water. Next, a liquid raw material called varnish in which a low molecular weight component (precursor) having a bond of silicon (Si) and oxygen (O) is dissolved in a solvent is applied to the substrate by a spin coating method or the like. Then, by heating the varnish with the substrate, both volatilization (evaporation) of the solvent and cross-linking reaction of the low molecular weight component are promoted to obtain a thin film. After that, a coating film formed on the periphery of an edge surface of the substrate is removed. In the case where the insulating layer (a bank) is formed, patterning may be carried out to obtain the desired shape. Moreover, the thickness of the film is controlled by the number of spin rotation, period of rotation, concentration and viscosity of the varnish. As the porous silica material, a porous silica film formed by forming a gel film with a mixed solution of TEOS (tetraethoxysilane), water, and ethanol and by thereafter volatilizing the solvent of the mixed solution may be used.

Next, the porous film 162 is patterned by using a photomask or the like formed by resist. The porous film 162 is patterned to form a porous film 166 in the same area as a conductive layer so as to be a base film of the conductive layer (shown in FIG. 11B).

Figure 11C:
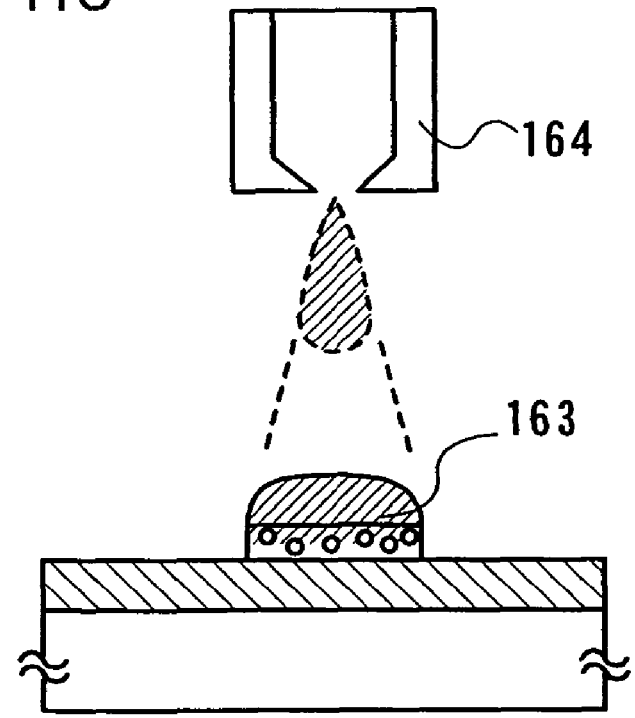

Next, a conductive layer 163 is formed by discharging a composition including a conductive material on the porous film 166 (shown in FIG. 11C). A droplet discharging means 164 is used to form the conductive layer 163. The droplet discharging means 164 is a generic term for what has a means for discharging a droplet, such as a nozzle having a discharge opening for the composition and a head provided with one or a plurality of nozzles. A diameter of the nozzle provided with the droplet discharging means 164 is set to be from 0.02 to 100 μm (preferably, 30 μm or less), and the amount of the composition discharged from the nozzle is set to be from 0.001 pl to 100 pl (preferably, 10 pl or less). The discharge amount increases in proportion to the diameter of the nozzle. In addition, the distance from the object to be processed to a discharge opening is preferably to be as close as possible to discharge the composition to the desired place. The distance is preferably set from 0.1 to 3 mm (more preferably, 1 mm or less).

Since the composition including the conductive material is discharged on the porous film 166 formed as a base film, the discharged droplet soaks so that the pattern is prevented from spreading transversely. FIG. 11C shows an example in which the composition including a conductive material soaks into almost in the middle of the porous film 166 in a thickness direction, however, may soak into the insulating layer 161. Therefore, the composition including a conductive material is formed on only the porous film formed in advance, thus a thin wiring having a desired pattern can be formed.

As the composition discharged from the discharge opening, a composition in which the conductive material is dissolved or dispersed in a solvent is used. The conductive material corresponds to fine particles or dispersion nanoparticles of metal such as Ag, Au, Cu, Ni, Pt, Pd, Ir, Rh, W, and Al, metal sulfide of Cd and Zn, oxide of such as Fe, Ti, Si, Ge, Si, Zr, Ba, and silver halide. Moreover, the conductive material corresponds to such as indium tin oxide (ITO) used as a transparent conductive film, ITSO formed by indium tin oxide and silicon oxide, organic indium, organic tin, zinc oxide, titanium nitride, or the like. However, as the composition discharged from the discharging opening, a composition in which any one material of Au, Ag, and Cu is dissolved or dispersed in a solvent is preferably used by considering specific resistance value, and more preferably, Ag or Cu having low resistance may be used. However, in case of using Ag or Cu, it is preferably to additionally provide a barrier film to avoid impurities. As the solvent, esters such as butyl acetate and ethyl acetate, alcohols such as isopropyl alcohol and ethyl alcohol, an organic solvent such as methyl ethyl ketone and acetone, or the like, is used. Viscosity of the composition is preferably 50 cp or less to prevent the composition from drying and to discharge the composition from the discharge opening smoothly. Moreover, the surface tension of the composition is preferably 40 mN/m or less. However, the viscosity of the composition and the like may be arbitrarily controlled in accordance with the solvent or the usage. As an example, the viscosity is preferably set as follows: the viscosity of a composition in which ITO, organic indium, or organic tin is, dissolved or dispersed in a solvent is set from 5 to 50 mPa·S, the viscosity of a composition in which Ag is dissolved or dispersed in a solvent is set from 5 to 20 mPa·S, and the viscosity of a composition in which Au is dissolved or dispersed in a solvent is set from 10 to 20 mPa·S.

The diameter of a particle of an electric conductor is preferably to be small as possible to prevent each nozzle from clogging and to manufacture a pattern of high precision, and the grain diameter is preferably 0.1 μm or less, though it depends on the diameter of each nozzle, the desired shape of a pattern, and the like. The compound is formed by a known method such as an electrolytic method, an atomization method, or a wet reduction method, or the like, and the grain diameter is approximately from 0.01 to 10 μm in general. However, in the case where the particle of the electric conductor is formed by a gas evaporation method, a nanoparticle protected by a dispersing agent is as minute as approximately 7 nm, and in the case where each surface of the nanoparticle is covered with a coating agent, the nanoparticle is stably dispersed at room temperature without cohering in the solvent, and shows almost the same behavior as liquid. Therefore, the coating agent is preferably used.

As for a step of discharging the compound under reduced pressure, a subsequent step of drying and baking can be omitted, since the solvent of the composition is volatilized while the composition is discharged and reaches the object to be processed. In addition, it is preferably to carry out the step under reduced pressure, since an oxide film or the like is not formed on the surface of a conductor. Moreover, one or both steps of drying and baking are carried out after the composition is discharged. The drying step and the baking step are steps of heating treatment; however, the purpose, temperature, and time of the each step are different. For example, the drying step is carried out at a temperature of 100° C. for three minutes, and the baking step is carried out at a temperature of from 200 to 350° C. for from 15 to 30 minutes. The drying step and the baking step are carried out under normal pressure or reduced pressure by irradiation with laser light, rapid thermal annealing, and by using a heating furnace, and the like. Note that timing of carrying out the heat treatment is not particularly limited. To carry out the drying step and the baking step preferably, the substrate may be heated in advance, and the temperature at that time is generally set to be from 100 to 800° C. (preferably from 200 to 350° C.), though it depends on the material of the substrate and the like. According to the steps, nanoparticles are in contact with one another, and fusion and welding are accelerated by volatilizing a solvent in the composition or chemically eliminating the dispersing agent in order that resin in the periphery to cure and shrink.

A continuous wave or pulsed gas laser or solid state laser may be used for irradiation with laser light. An excimer laser, a YAG laser, or the like, can be given as the former gas laser, while lasers using crystals such as YAG or YVO$_4$ doped with Cr, Nd, or the like, can be given as the latter solid state laser. The continuous wave laser is preferably used in relation to the absorptance of laser light. Alternatively, a so-called hybrid laser irradiation method combining pulsed oscillation and continuous-wave oscillation may be employed. Note that heat treatment by irradiation with the laser light may be instantaneously performed for several microseconds to dozens of seconds so as not to destroy the substrate 160 according to heat resistance of the substrate 160. Rapid thermal annealing (RTA) is carried out by instantaneously heating the substrate for from several microseconds to several minutes while rapidly raising the temperature by using an infrared lamp, a halogen lamp, Or the like, that emits ultraviolet light to infrared light in an inert gas atmosphere. This treatment is carried out instantaneously, and therefore, only the top surface of a thin film is substantially heated not to adversely influence underlying films. That is, a substrate that is weak in heat resistance such as a plastic substrate is not influenced by the heat treatment.

Moreover, an insulating layer may be formed as a protective film on the porous film 166 and the conductive layer 163, though not shown. As a material for the insulating layer, a known material such as an oxide material or a nitride material of silicon may be used, but more preferably, a silicon nitride film having fine film quality may be used.

The conductive layer formed as described above may be used as a wiring, or may be used as one of the components of a thin film transistor by using the conductive layer 163 as a gate electrode, and by using the insulating layer 161 as a gate insulating film.

As described above, a conductive layer can be formed to be thin and to the desired pattern according to the present invention that the porous film 166 is formed as a base film of the conductive layer 163.

Embodiment Mode 5

An embodiment mode of the present invention is described with reference to FIGS. 3A to 3D, 4A to 4C, 5A to 5C, and 7. More specifically, a method for manufacturing a thin film transistor according to the present invention and a method for manufacturing a semiconductor device (a display device) using the thin film transistor are described. First, a method for manufacturing a channel etch type thin film transistor using a gate electrode, a source wiring, and a drain wiring manufactured according to the present invention and a method for manufacturing a display device using the thin film transistor are described with reference to FIGS. 3A to 3C and 5A. The channel etch type transistor is a transistor in which an amorphous semiconductor (an amorphous silicon, a-Si) serves as a channel region.

A porous film 201 is formed over a substrate 200. As a material for the porous film, a porous material having a siloxane bond (for example, a porous material having a methylsiloxane-based polymer skeleton), a porous organic resin material as typified by porous polyimide, and porous silica material, and the like, can be used. As a material for an inorganic porous material, other material such as a film comprising fine particles of aluminum oxide (also referred to as alumina), can be used. As a method for forming the porous film, an application method, a droplet discharge method, or the like may be used. Moreover, a porous material that a porous spray coating, an electrolytic oxidation coating, a chemical conversion coating, etching treatment, or the like is carried out for a nonporous material to be porous may be used. As the porous silica material, a porous silica film formed by forming a gel film with a mixed solution of TEOS (tetraethoxysilane), water, and ethanol and by thereafter volatilizing the solvent of the mixed solution may be used.

Next, a conductive layer 202 that serves as a gate electrode later is formed by discharging a composition including a conductive material. The conductive layer 202 is formed by using a droplet discharging means. Next, an insulating layer 219 is formed as a protective film over the porous film 201 and the conductive layer 202 (shown in FIG. 3A). As a material for the insulating layer 219, a known material such as an oxide material or a nitride material of silicon may be used, but preferably, a silicon nitride film having fine film quality may be used.

Figure 3A:
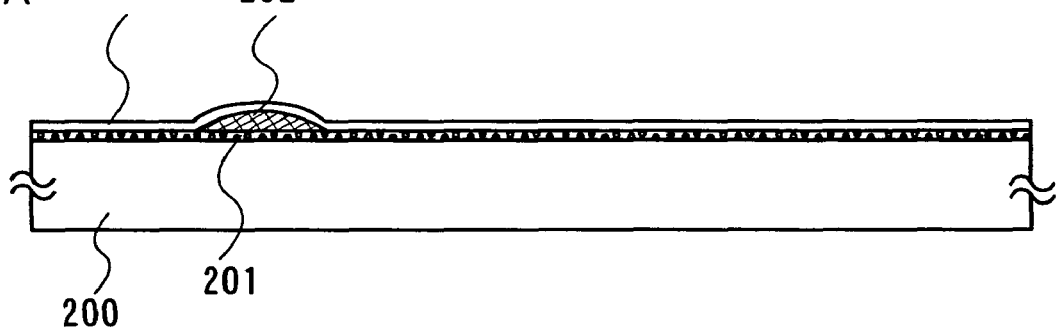
FIGS. 3A to 3D are explanatory views for a manufacturing method of a channel etch type thin film transistor (Embodiment Mode 3).
Figure 3B:
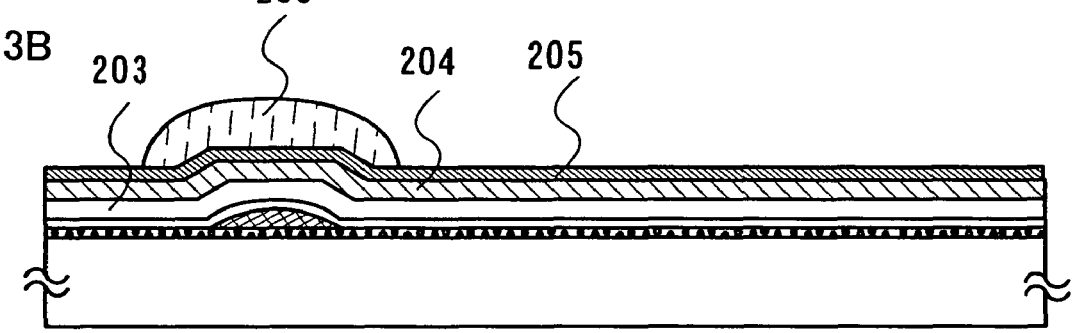
Figure 3C:
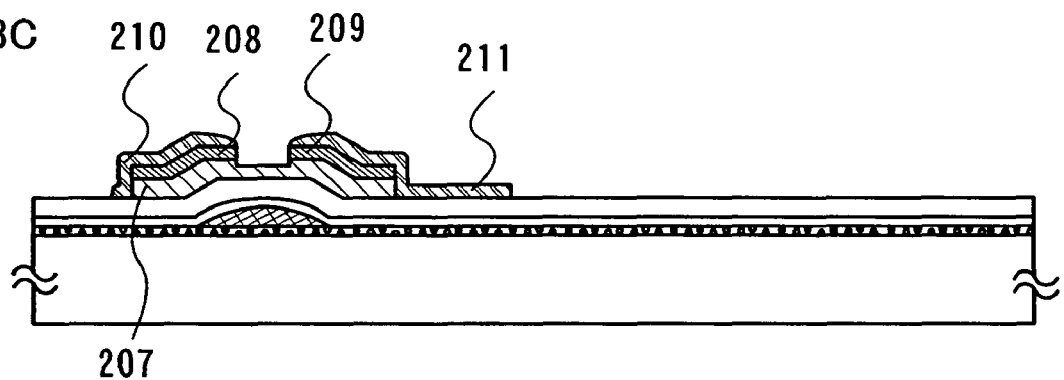

Next, an insulating layer 203 that serves as a gate insulating film, an amorphous semiconductor layer 204, and an n-type amorphous semiconductor layer 205 are formed to be laminated (shown in FIG. 3B). Next, a mask 206 formed by insulator such as resist and polyimide is formed, and the amorphous semiconductor layer 204 and the n-type amorphous semiconductor layer 205 is simultaneously patterned by using the mask 206 to form an amorphous semiconductor layer 207 and n-type amorphous semiconductor layers 208 and 209. Next, the mask 206 is removed, then, conductive layers 210 and 211 are formed by discharging a composition including a conductive material, and then, the n-type amorphous semiconductor layer is patterned by using the conductive layers 210 and 211 as a mask to form the n-type amorphous semiconductor layers 208 and 209 (shown in FIG. 3C). Note that a porous film may be selectively formed in a portion where the conductive layers 210 and 211 are in contact with the gate insulating film 203 before forming the conductive layers 210 and 211, though not shown. Accordingly, the conductive layers 210 and 211 are formed to be thin.

Through the above-described steps, a channel etch type thin film transistor is completed. Next, insulating layers 212, 213, and 214 are formed to be laminated. As a material for the insulating layer 213, a compound material formed by polymerization of an organic material, and a siloxane-based polymer, and the like is preferably used. Moreover, as shown in Embodiment Mode 2, a porous film may be used for the insulating layer 213 that is an interlayer film. In the case where an organic material is used, thin films may be formed over the insulating layers 212 and 214 by using an inorganic material including silicon to prevent degassing.

Then, a porous film 215 is formed over the insulating layer 214. As a material for the porous film, a porous material having a siloxane bond (for example, a porous material having a methylsiloxane-based polymer skeleton), a porous organic resin material as typified by porous polyimide, and porous silica material, and the like, can be used. As a material for an inorganic porous material, other material such as a film comprising fine particles of aluminum oxide (also referred to as alumina), can be used. As a method for forming the porous film, an application method, a droplet discharge method, or the like may be used. Moreover, as a material for a nonporous material, a porous spray coating, an electrolytic oxidation coating, a chemical conversion coating, or a porous film formed to be porous by etching treatment, and the like, may be used. As the porous silica material, a porous silica film formed by forming a gel film with a mixed solution of TEOS (tetraethoxysilane), water, and ethanol and by thereafter volatilizing the solvent of the mixed solution may be used.

Figure 3D:
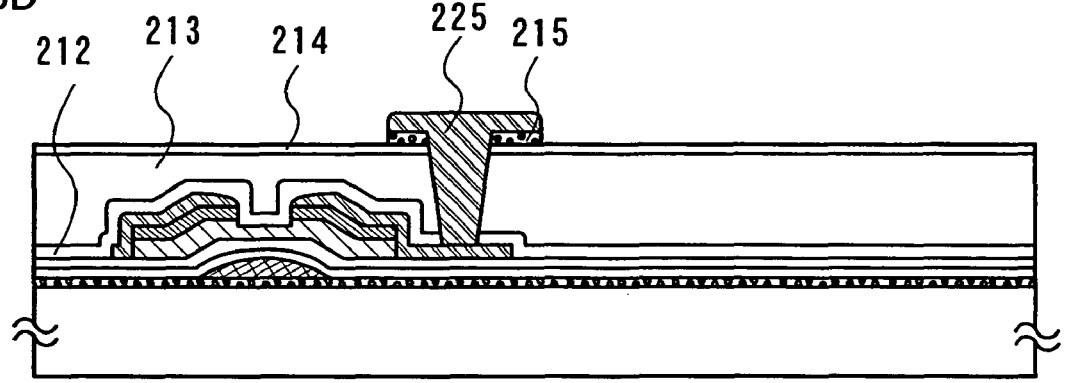

Next, an opening is formed in the insulating layers 212, 213, and 214, and the porous film 215 by using photolithography (shown in FIG. 3D). Then, a conductive layer 225 is formed by discharging a composition including a conductive material by using a droplet discharging means. The conductive layer 225 may serve as a source or drain electrode. Then, the porous film 215 is etched by using the conductive layer 225 as a mask.

Figure 5A:
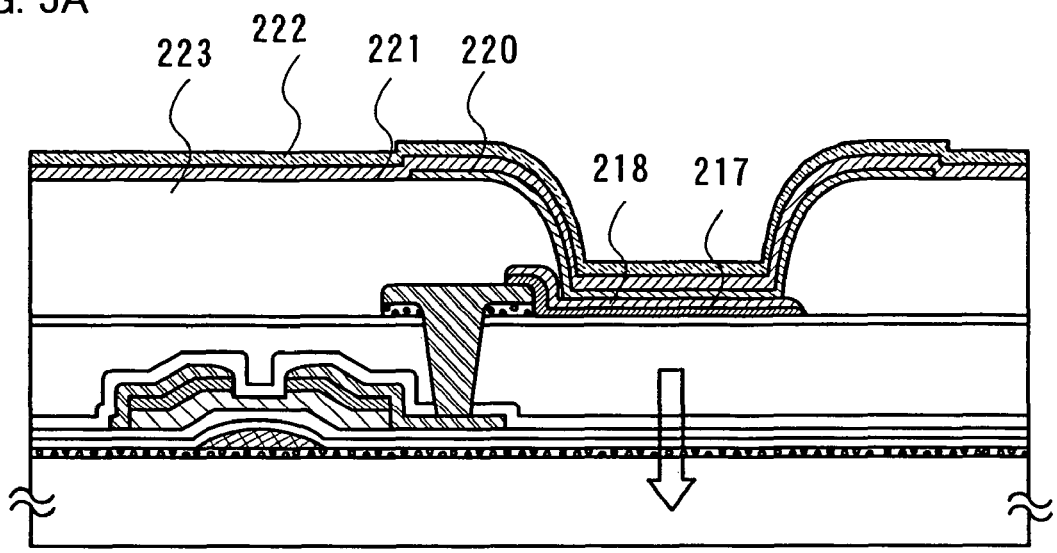
FIGS. 5A to 5C are explanatory views for a manufacturing method of a display device (Embodiment Mode 5).

Next, conductive layers 217 and 218 are formed to be in contact with the conductive layer 225 by discharging a composition including a conductive material (shown in FIG. 5A). The conductive layers 217 and 218 are formed by a light-transmitting conductive material, and more specifically, by using indium tin oxide (ITO) and ITSO including ITO and silicon oxide. Then, an insulating layer 223 is formed to be a bank (an embankment), and an electroluminescent layer 220, a conductive layer 221, and a shield 222 are formed to be laminated so as to be in contact with the conductive layer 218. Thus, a display device having a display function using a light emitting element is completed. In the above-mentioned structure, a transistor that drives the light emitting element corresponds to an n-type transistor, the conductive layer 218 corresponds to a cathode, and the conductive layer 221 corresponds to an anode. Thus, a so-called display device of bottom emission type in which light emitted from the light emitting element is emitted to the substrate 200 side is completed. In the above-mentioned manufacturing steps, the conductive layers 202 and 225 can be formed to be thin and to the desired pattern by forming the porous film before the conductive layers 202 and 225 are formed by using a droplet discharge method.

Next, a method for manufacturing a channel protection type thin film transistor using a gate electrode manufactured according to the present invention and a method for manufacturing a display device using the thin film transistor are described with reference to FIGS. 4A to 4C and FIG. 5B. The channel protection type transistor is a transistor in which an amorphous semiconductor serves as a channel region.

A porous film 251 is formed over a substrate 250. As a material for the porous film, a porous material having a siloxane bond (for example, a porous material having a methylsiloxane-based polymer skeleton), a porous organic resin material as typified by porous polyimide, and porous silica material, and the like, can be used. As a material for an inorganic porous material, other material such as a film comprising fine particles of aluminum oxide (also referred to as alumina), can be used. As a method for forming the porous film, an application method, a droplet discharge method, or the like may be used. Moreover, as a material for a nonporous material, a porous spray coating, an electrolytic oxidation coating, a chemical conversion coating, or a porous film formed to be porous by etching treatment, and the like, may be used. As the porous silica material, a porous silica film formed by forming a gel film with a mixed solution of TEOS (tetraethoxysilane), water, and ethanol and by thereafter volatilizing the solvent of the mixed solution may be used.

Next, a conductive layer 252 that serves as a gate electrode later is formed by discharging a composition including a conductive material. The conductive layer 252 is formed by using a droplet discharging means. Next, an insulating layer 262 is formed as a protective film over the porous film 251 and the conductive layer 252 (shown in FIG. 4A). As a material for the insulating layer 262, a known material such as an oxide material or a nitride material of silicon may be used, but preferably, a silicon nitride film having fine film quality may be used.

Figure 4A:
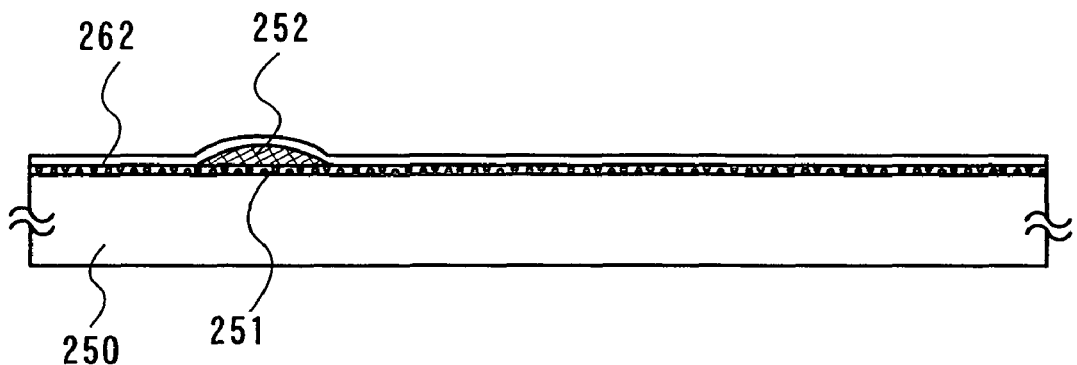
FIGS. 4A to 4C are explanatory views for a manufacturing method of a channel protection type thin film transistor (Embodiment Mode 3).
Figure 4B:
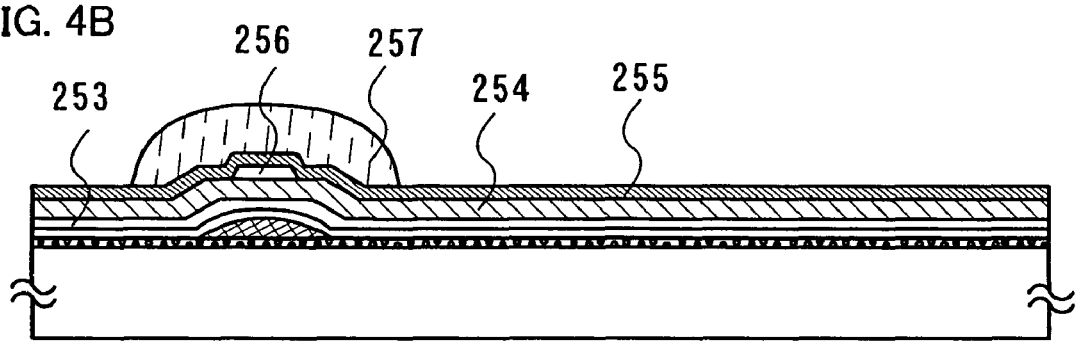

Next, an insulating layer 253 that serves as a gate insulating film, an amorphous semiconductor layer 254, an insulating layer 256, and an n-type amorphous semiconductor layer 255 are formed to be laminated (shown in FIG. 4B). The insulating layer 256 may be formed by using photolithography after forming an insulating film over the entire surface, or by using a droplet discharge method. Note that in using photolithography, the insulating layer 256 may be formed by exposing the backside to light using the conductive layer 252 that serves as a gate electrode. Accordingly, a step for applying resist can be omitted.

Figure 4C:
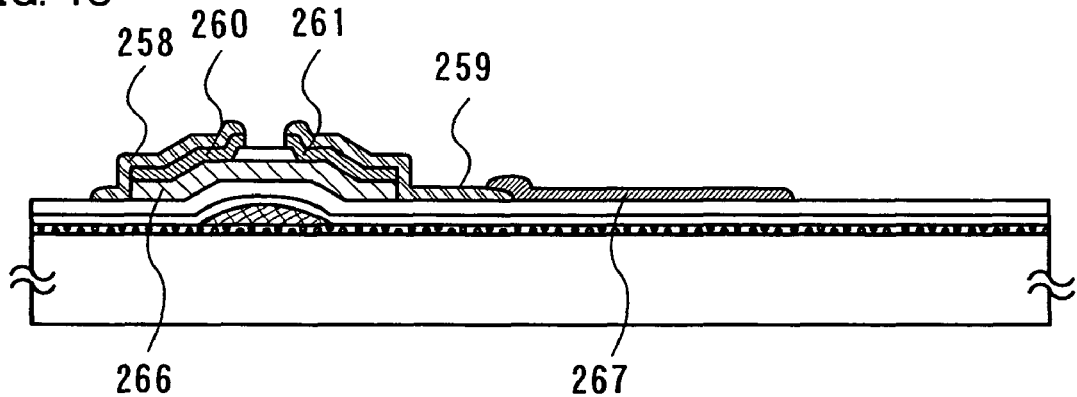

Next, a mask 257 formed by insulator such as or polyimide is formed, and the amorphous semiconductor layer 254 and the n-type amorphous semiconductor layer 255 is simultaneously patterned by using the mask 257 to form an amorphous semiconductor layer 266 and n-type amorphous semiconductor layer (shown in FIG. 4C). Then, conductive layers 258 and 259 are formed by discharging a composition including a conductive material, and the n-type amorphous semiconductor layer is patterned by using the conductive layers 258 and 259 as a mask. Accordingly, n-type amorphous semiconductor layers 260 and 261 are formed.

According to the above-mentioned steps, the channel protection type thin film transistor is completed. Next, a conductive layer 267 that serves as a pixel electrode is formed to be in contact with the conductive layer 259 by discharging a composition including a conductive material. Then, an insulating layer 272 is formed to be an embankment (a bank), and an electroluminescent layer 270 and a conductive layer 271 are formed to be laminated so as to be in contact with the conductive layer 267. Thus, a display device having a display function using a light emitting element is completed (shown in FIG. 5B). In the above-mentioned structure, a transistor that drives the light emitting element corresponds to an n-type transistor, the conductive layer 267 corresponds to an anode, and the conductive layer 271 corresponds to a cathode. Thus, a so-called display device of top emission type in which light emitted from the light emitting element is emitted to the opposite side of the substrate 200 is completed. In the above-mentioned manufacturing steps, the conductive layer 252 can be formed to be thin and to the desired pattern by forming the porous film before the conductive layer 252 is formed by using a droplet discharge method.

Figure 5B:
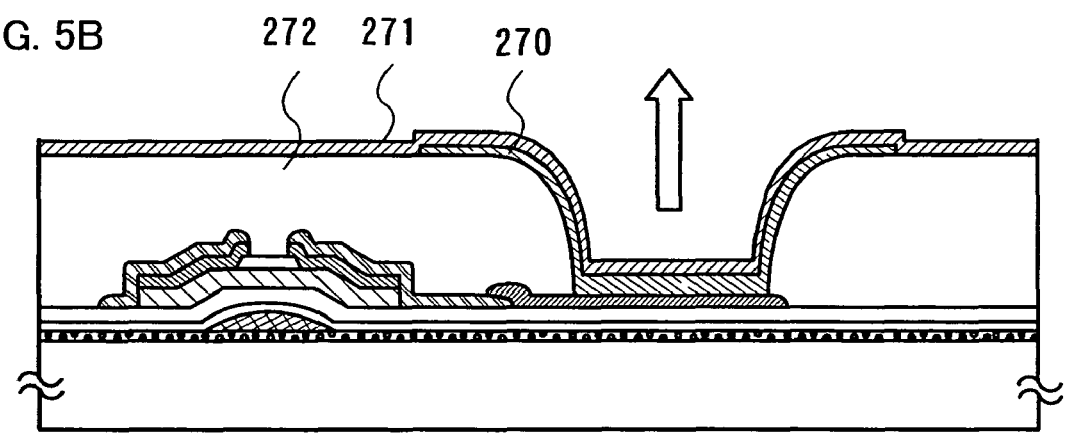
Figure 5C:
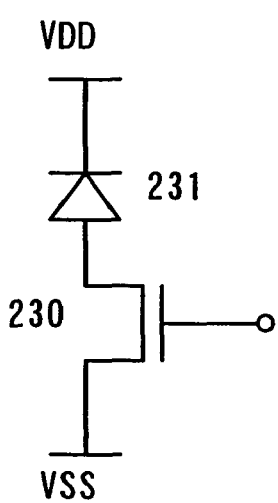

Note that FIG. 5C is a diagram for showing an equivalent circuit of the structure shown in FIGS. 5A and 5B, and more specifically, a diagram for showing an equivalent circuit of an n-type driving transistor 230 and a light emitting element 231.

For the semiconductor layers 204 and 254, an amorphous semiconductor or a semi-amorphous semiconductor (hereinafter, SAS) in which crystal grains are dispersed in the amorphous semiconductor may be used.

A transistor using SAS has an electron field effect mobility of from 2 to 20 $cm^2/V \cdot sec$, which is as much as from 2 to 20 times of a transistor using amorphous semiconductor, and has an intermediate structure between amorphous and crystalline structure (including a single crystal and polycrystal). A SAS has the third condition that is stable with respect to free energy, and has crystallinity having short-range order and lattice distortion. Moreover, the crystal grains can be dispersed into an amorphous semiconductor, setting the grain diameter at from 0.5 to 20 nm. In addition, a SAS includes hydrogen or halogen of 1 atom % or more as a neutralizing agent of dangling bond. Furthermore, the lattice distortion is more promoted by including rare gas element such as Helium, Argon, Krypton, and Neon to increase stability. Accordingly, a favorable SAS are obtained.

Figure 7:
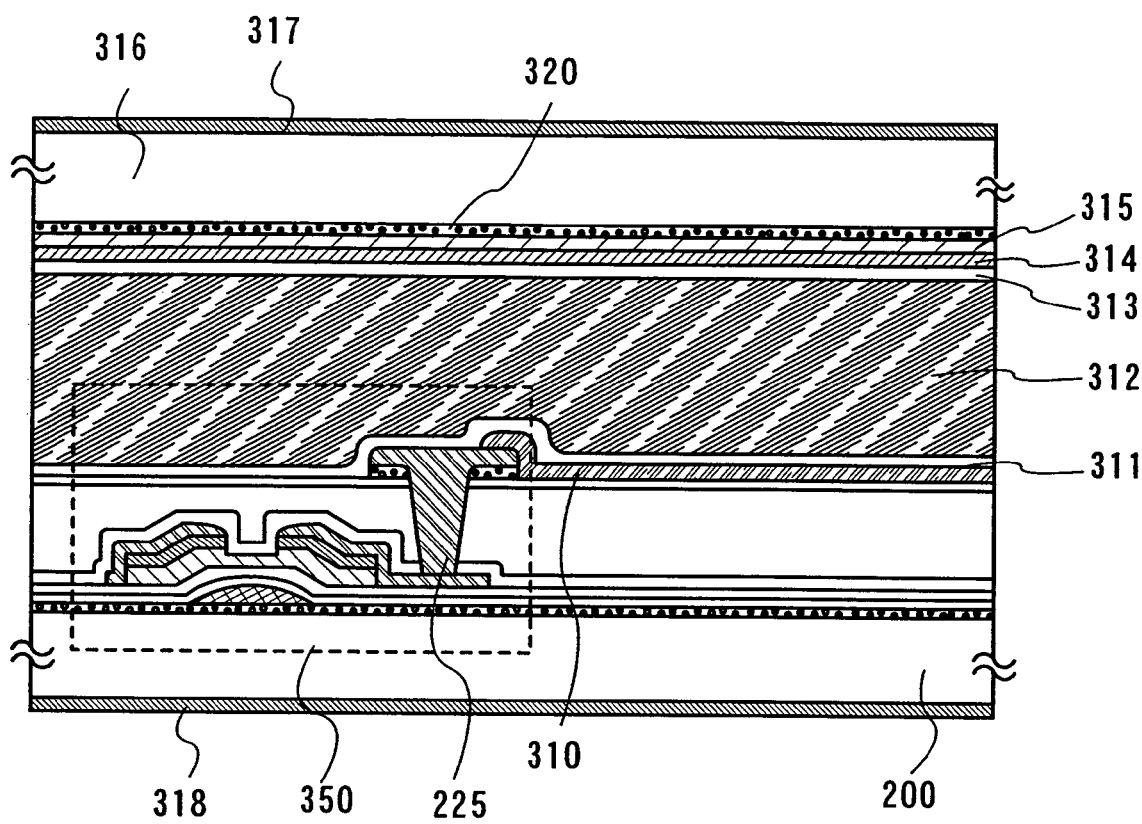
FIG. 7 is an explanatory view for a manufacturing method of a display device connected to a channel etch type thin film transistor (Embodiment Mode 4).

Note that as in manufacturing steps shown in FIGS. 3A to 3D, 4A to 4C, and 5A to 5C, a display element such as a light emitting element and a liquid crystal element may be formed over the upper layer of the thin film transistor, and thus, a display device having a display function is completed. FIG. 7 shows a display device in which a liquid crystal element is formed over the upper layer of a channel etch type thin film transistor manufactured by this embodiment mode.

A conductive layer 310 that serves as a pixel electrode is formed to be in contact with the conductive layer 225 of the channel etch type thin film transistor 350 manufactured according to this embodiment mode, and an orientation film 311 is formed. Then, a substrate 316 provided with a color filter 315, an opposite electrode 314, and an orientation film 313 is prepared, and the substrate 316 is bonded to the substrate 200 by heating and curing of a sealant (not shown). The color filter 315 can also be formed by a droplet discharge method, and can use the present invention. In this embodiment mode, a porous film 320 is formed as a base film of the color filter 315. Moreover, though only one pixel is shown in FIG. 7, a light-shielding film (a black matrix) may be used to separate each color filter of each color to obtain full color display. In addition, the porous film 320 that serves as a base of the color filter 315 may be patterned for each color of each color filter. According to the present invention, the color filter can be formed to the desired pattern. Thus, a clear and high quality image can be displayed.

After that, a display device provided with a display function using a liquid crystal element by injecting liquid crystal 312. The substrates 200 and 316 are bonded to polarizing plates 317 and 318. In the above-described manufacturing steps, the conductive layers 202 and 225 can be formed to be thin and to the desired pattern by forming a porous film before forming the conductive layers 202 and 225 by a droplet discharge method. This embodiment mode can be freely combined with the above-described embodiment mode.

Embodiment 1

A thin film transistor can be formed according to the present invention, and a semiconductor device (a display device) can be formed by using the thin film transistor. In the case where a light emitting element is used as a display element and a p-type transistor is used as a transistor which drives the light emitting element, light emitted from the light emitting element is emitted from either a top surface or a bottom surface; or both surfaces. Here, a laminated structure of the light emitting element which can be applied to any of the above emission types is described.

Figure 8A:
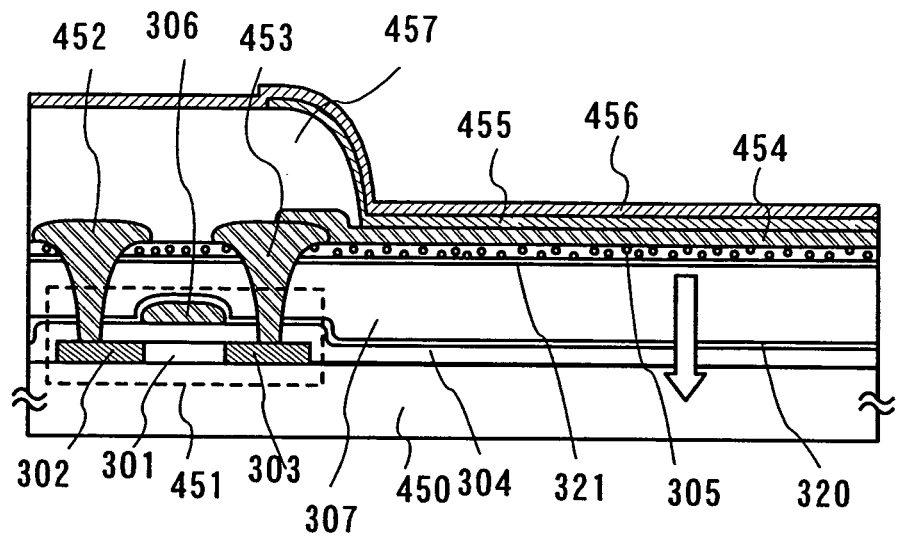
FIGS. 8A to 8C are explanatory views for a laminated structure of a staggered thin film transistor and a light emitting element connected to the thin film transistor (Embodiment 1).

Moreover, in this embodiment mode, a method for manufacturing a thin film transistor of top gate type in which the present invention is applied to the manufacturing of a gate electrode is described with reference to FIG. 8A. In the transistor, a polycrystal semiconductor is used for the channel region.

An amorphous semiconductor is formed over a substrate 450 to be polycrystalline semiconductor by crystallizing the amorphous semiconductor with a known crystallization method such as a laser crystallization method. Next, an insulating layer 304 is formed over the semiconductor (shown in FIG. 8A). Note that an insulating film that serves as a base film may be formed over the substrate 450 to prevent an impurity from intruding from the substrate 450, if necessary. Continuously, a conductive layer 306 is formed to serve Is a gate electrode later. In forming the conductive layer 306, a droplet discharge method may be used. Moreover, a porous film may be formed under the conductive layer 306, though not shown. Next, an insulating layer 320 is formed to serve as a protective film over an insulating layer 304 and the conductive layer 306 (shown in FIG. 8A). As a material for the insulating layer 320, a known material such as an oxide material or a nitride material of silicon may be used, and more preferably, a silicon nitride film having fine film quality may be used. Furthermore, impurity regions 302 and 303 doped with impurities and a channel region 301 are formed by doping impurities to a semiconductor using the conductive layer 306 as a mask.

After forming an insulating layer 307, an insulating layer 321 is formed as a protective film, and a porous film 305 is formed. Next, openings are formed in the insulating layers 307 and 321, and the porous film 305 by using photolithography. Then, a compound including a conductive material is discharged on the porous film 305 to fill the openings thereby forming conductive layers 452 and 453. The conductive layers 452 and 453 can be formed to be thin without spreading transversely, since the composition including a conductive material soaks into (is adsorbed to) the porous film 305. Thus, a display device in which a light emitting element is formed over the upper layer of a top gate type thin film transistor having a gate electrode manufactured in the above steps according to the present invention is manufactured.

Figure 8B:
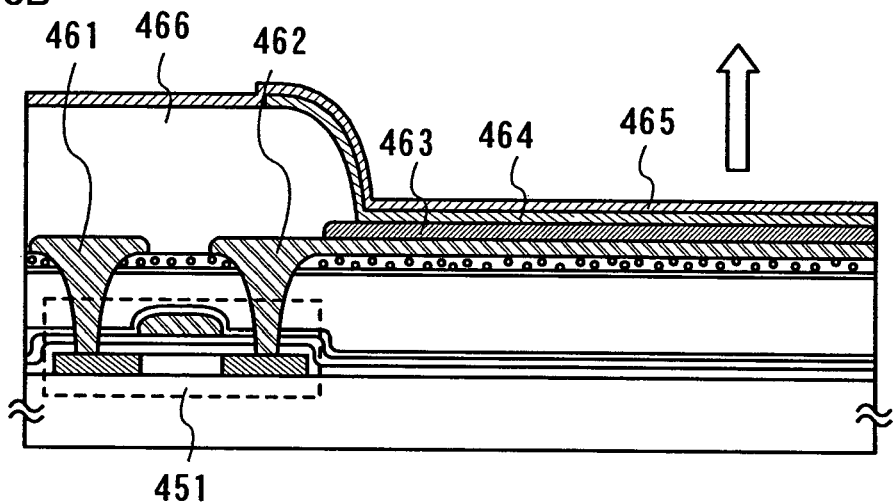
Figure 8C:
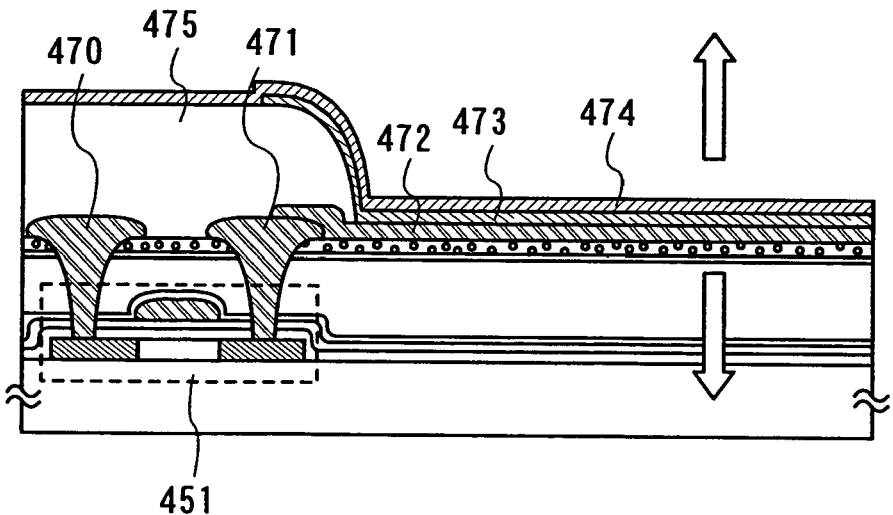

First, the case where light is emitted to the substrate 450 side, in other words, light is emitted from a bottom surface is described with reference to FIG. 8A. In this case, source and drain wirings 452 and 453, an anode 454, a bank 457, an electroluminescent layer 455, and a, cathode 456 are sequentially laminated to be electrically connected to a transistor 451. Next, the case where light is emitted to the opposite side of the substrate 450 side, in other words, light is emitted from a top surface is described with reference to FIG. 8B. Source and drain wirings 461 and 462, an anode 463, a bank 466, an electroluminescent layer 464, and a cathode 465 are sequentially laminated to be electrically connected to a transistor 451. According to the above-described structure, though light transmits the anode 463, the light is emitted to the opposite side of the substrate 450 since the wiring 462 reflects the light. Note that in this structure, it is not necessary to use a light-transmitting material for the anode 463. Moreover, though not shown in FIG. 8A to 8C, a color filter may be formed on the opposing substrate of the substrate 450. The color filter can be formed by using a droplet discharge method, and in the case, a porous film can be formed as a base film. Using the porous film of the present invention, the color filter can be formed to the desired pattern. Finally, the case where light is emitted to the substrate 450 side and to the opposite side thereof, in other words, light is emitted from both surfaces is described with reference to FIG. 8C. Source and drain wirings 470 and 471, an anode 472, a bank 475, an electroluminescent layer 473, and a cathode 474 are sequentially laminated to be electrically connected to a transistor 451. In this case, both of the anode 472 and the cathode 474 are formed by a light-transmitting material or a material with a thickness that light can be transmitted through to achieve dual emission.

According to the above-described structure, a material having a low work function can be used for the cathodes 456, 465, and 474, and for example, Ca, Al, CaF, MgAg, AlLi, and the like are desirably used. The electroluminescent layers 455, 464, and 473 may have any one of a single-layer structure, a laminated structure, or a mixed structure which has no interface of layers. Moreover, as a material for the electroluminescent layers 455, 464, and 473, any one of a singlet material, a triplet material, or a combined material thereof, an organic material including a low molecular weight material, a high molecular weight material, and an intermediate molecular weight material, an inorganic material as typified by a molybdenum oxide and the like that is superior in electron injection characteristics, or a compound material of an organic material and an inorganic material may be used. The anodes 454, 463, and 472 are formed by a transparent conductive film that transmits light, and for example, a transparent conductive film in which from 2 to 20% zinc oxide (ZnO) is mixed with indium oxide is used, in addition to ITO and ITSO. Note that plasma treatment in an oxygen atmosphere or heat treatment in a vacuum atmosphere may be carried out before the anodes 454, 463, and 472 are formed. Banks 457, 466, and 475 are formed by a material including silicon, an organic material, and a compound material, and moreover, a porous film. It is preferable that the banks 457, 466, and 475 are formed by a photosensitive material or a non-photosensitive material such as acrylic or polyimide, since curvature radius of the side face of each bank is varied continuously, and the upper layer of the thin film is formed without disconnection. This embodiment can be freely combined with the above-described embodiment mode.

Embodiment 2

An appearance of a panel of the one mode of a semiconductor device to which the present invention is applied is described with reference to FIG. 9.

Figure 9:
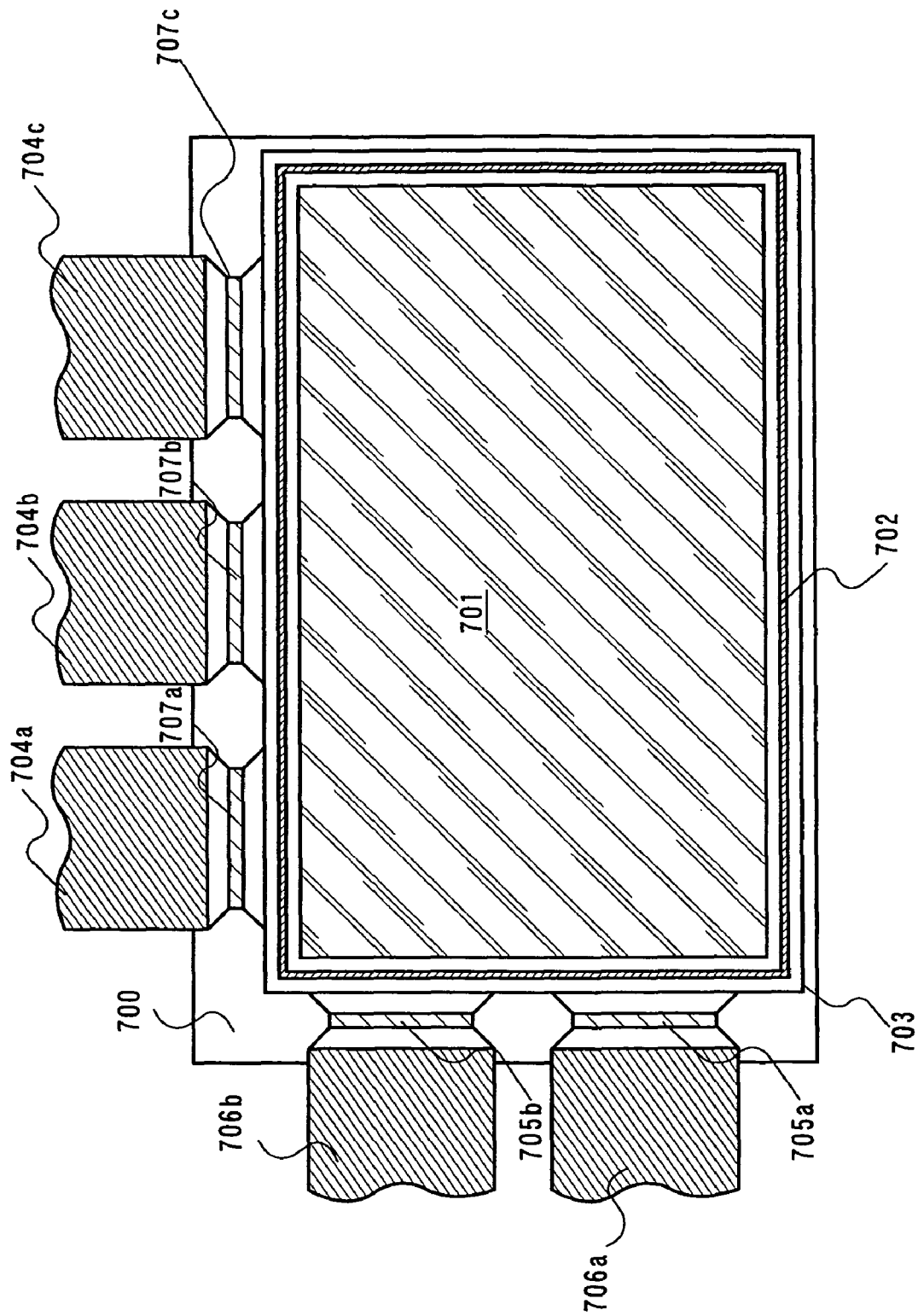
FIG. 9 is a top view of a panel that is one mode of a semiconductor device to which the present invention is applied (Embodiment 2).

As for the panel shown in FIG. 9, a driver IC provided with a driver circuit is mounted on the periphery of a pixel portion 701 by a COG (Chip On Glass) method. Of course, the driver IC may be mounted by TAB (Tape Automated Bonding) method.

A substrate 700 is bonded to an opposing substrate 703 with a sealant 702. The pixel portion 701 may be the one that either liquid crystal or EL element is used as a display medium. As for driver ICs 705*a*, 705*b*, and 707*a* to 707*c*, an integrated circuit formed by a TFT using polycrystal semiconductor may be formed, in addition to an integrated circuit formed by a TFT using single crystal circuit. A signal or power is supplied to the driver ICs 705*a*, 705*b*, and 707*a* to 707*c* via FPCs 704*a* to 704*c*, or FPCs 706*a* and 706*b*.

Next, an appearance of a panel of the one mode of a semiconductor device that is different from the above described with reference to FIGS. 12A and 12B. FIG. 12A is a top view of the panel, and FIG. 12B is a cross-sectional view taken along A-A' of FIG. 12A.

As shown in FIGS. 12A and 12B, a sealant 1309 is provided on a first substrate 1300 so as to surround a pixel portion 1313 and driver circuit portions 1302 and 1314, and a second substrate 1312 is sealed with the sealant 1309 after filler 1308 is formed over an element of the first substrate 1300. In FIG. 12B, a CMOS circuit 1301 included in the driver circuit portion 1302, a TFT 1303 included in the pixel portion 1313, and a light emitting element 1305 are illustrated. Various kinds of signals supplied to each circuit formed over the first substrate 1300 are supplied from a terminal portion 1345 via an FPC 1343.

In the above-described panel, the light emitting element 1305 is sealed with a glass substrate. The sealing process is a process for protecting the light emitting element from moisture, and one of the following methods are used as the sealing treatment: a method for mechanically sealing the light emitting element by a cover member, a method for sealing the light emitting element by thermosetting resin or ultraviolet curable resin, or a method for sealing the light emitting element by a thin film having high barrier capacity such as oxide and nitride of metal. As a material for the cover member, glass, ceramics, plastic, or metal is used. However, in the case that light is emitted to the cover member side, the cover member should be light transmitting. Moreover, the substrate provided with the light emitting element is bonded to the cover member with the sealant such as the thermosetting resin or the ultraviolet curable resin, and the resin is cured by heat treatment or ultraviolet irradiation treatment to form a sealed space. It is also effective that an absorbent material as typified by barium oxide is provided in the sealed space. In addition, the space between the cover member and the substrate where the light emitting element is formed can be filled with the thermosetting resin or the ultraviolet curable resin. In this case, it is effective that the absorbent material as typified by barium oxide is applied to the thermosetting resin or the ultraviolet curable resin.

Embodiment 3

Figure 13:
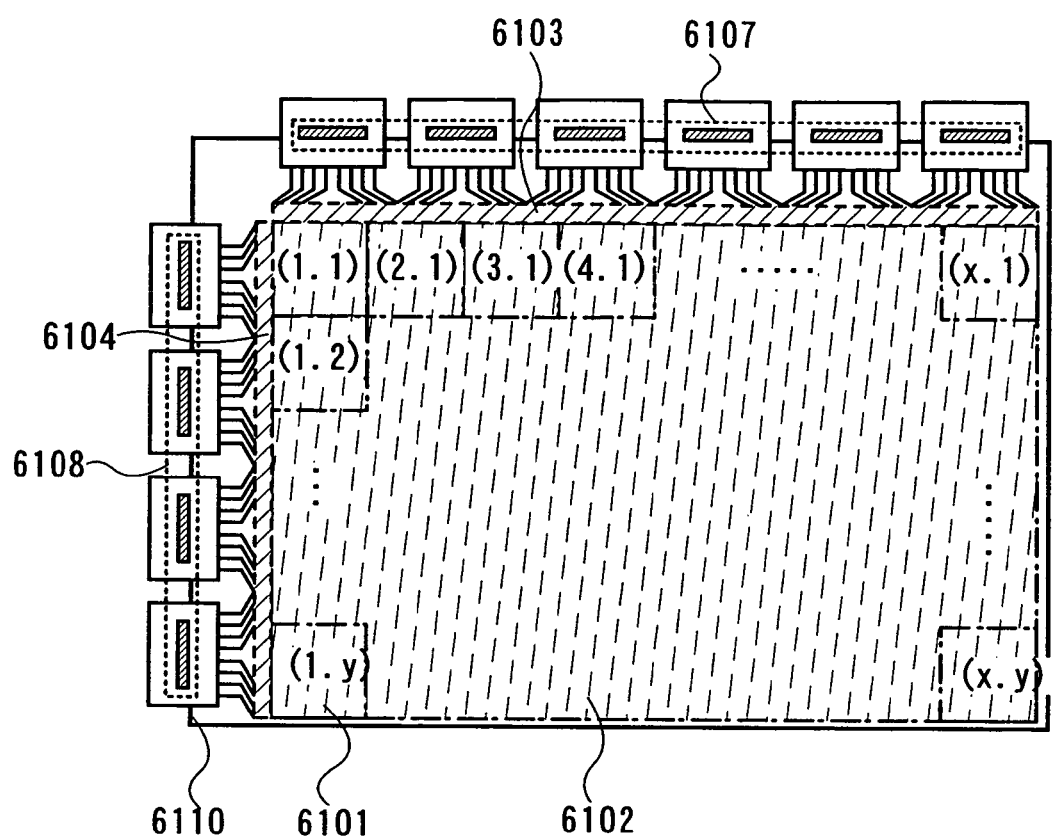
FIG. 13 is a view showing a semiconductor device that the present invention is applied (Embodiment 3).

A structure of a semiconductor device of the present invention having a display function is described with reference to FIG. 13. FIG. 13 is an explanatory top view for an outline of the semiconductor device. A pixel portion (a display portion)

6102 having at least a pixel 6101 and protection circuits 6103 and 6104 are provided over a substrate 6110, and are connected to a driver IC 6107 of a signal line side and a driver IC 6108 of a scanning line side via a lead wiring. In the case where an amorphous semiconductor or a microcrystal semiconductor is used as an element which constitutes the pixel portion 6102, the driver circuits 6107 and 6108 may be mounted by a known method such as a COG method and a TAB method as shown, and may be used as driver circuits. In the case where a microcrystal semiconductor is used as an element which constitutes the pixel portion 6102, a driver circuit of a scanning line side may be constituted by the microcrystal semiconductor and the driver IC 6107 may be mounted on the signal line side. As a structure different from the above-described structure, a structure may be formed that a portion of the driver circuit of the scanning line side and the signal line side may be formed over the same substrate, and the driver IC may be substituted for another portion. Thus, there are varieties of structures in mounting the driver IC, and any structures may be used in the present invention.

Figure 14A:
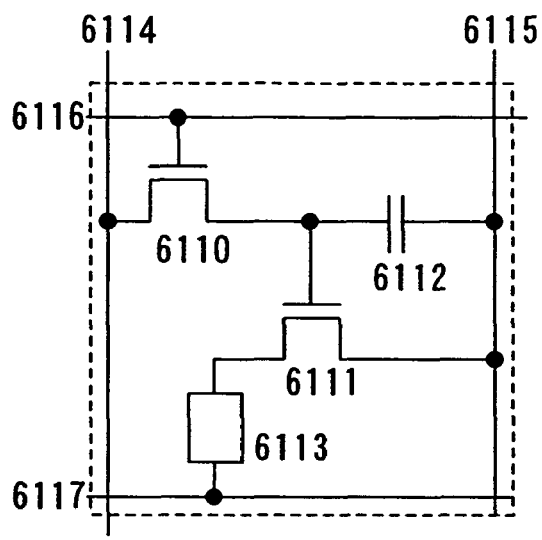
FIGS. 14A to 14C are diagrams showing a pixel circuit of a semiconductor device that the present invention is applied (Embodiment 3).

Next, a pixel circuit of a semiconductor device of the present invention having a display function is described with reference to FIGS. 14A to 14C. FIG. 14A is a diagram for showing an equivalent circuit of the pixel 6101. The pixel 6101 comprises a TFT 6110 that controls a video signal input to the pixel 6101, a TFT 6111 that controls current value which flows both of the electrodes of a light emitting element 6113, and a capacitor element 6112 that holds gate-source voltage of the TFT 6111. The pixel 6101 comprises the TFT 6110, the TFT 6111, the light emitting element 6113, and the capacitor element 6112 in a region surrounded with each wiring of a signal line 6114, power supply lines 6115 and 6117, and a scanning line 6116. Note that the capacitor element 6112 may not be provided in the case where gate capacity of the TFT 6111 or other parasitic capacity can serve as a substitute of the capacitor element 6112, though shown in FIG. 14A to 14C.

Figure 14B:
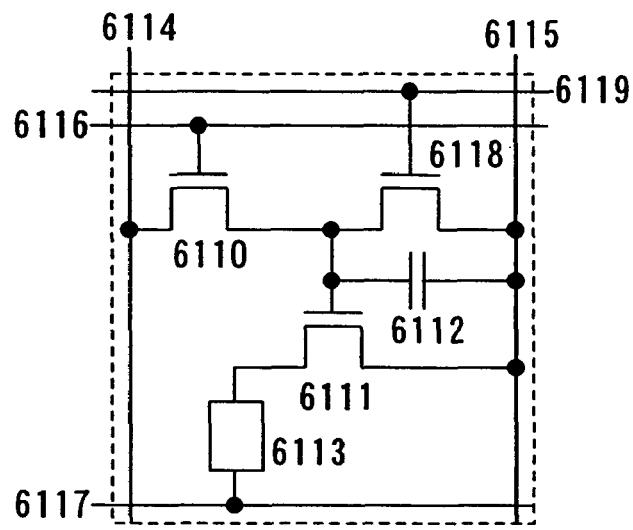

FIG. 14B shows a pixel circuit having a structure in which the pixel 6101 shown in FIG. 14A is newly provided with a TFT 6118 and a scanning line 6119. The condition that current does not compulsorily flow through the light emitting element 6113 can be made, depending on an arrangement of the TFT. Therefore, a lightning period can begin at the same time or just after a writing period begins without waiting for signal written to all pixels. Thus, duty ratio is improved, so that a moving image can be displayed particularly well.

Figure 14C:
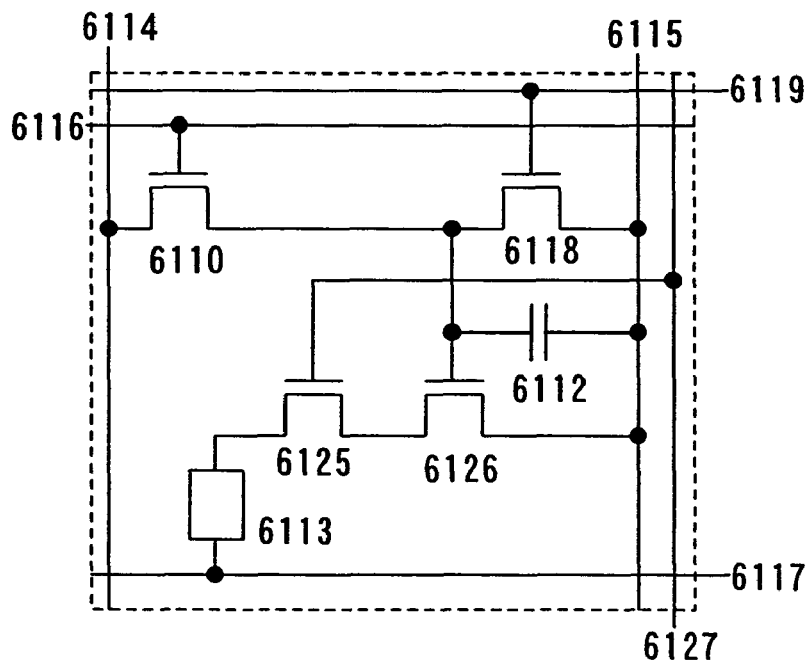

FIG. 14C shows a pixel circuit in which the TFT 6111 of the pixel 6101 shown in FIG. 14B is omitted and TFTs 6125 and 6126 and a wiring 6127 are newly provided. In this structure, a gate electrode of the TFT 6125 is connected to the wiring 6127 held in a certain electric potential to fix the electric potential of the gate electrode and to operate in a saturated region. Moreover, a video signal that transmits information of lightning or non-lightning of the pixel is inputted to a gate electrode of the TFT 6126 that is connected to the TFT 6125 in series and is operated in a linear region via the TFT 6110. Small variation of gate-source voltage of the TFT 6126 does not affect value of current that flows in the light emitting element 6113, since the value of source-drain voltage of the TFT 6126 that operates in a linear region is low. Therefore, the value of current that flows in the light emitting element 6113 is determined by the TFT 6125 that operates in a saturated region. According to the present invention having the above-described structure, image quality can be enhanced by improving brightness variation of the light emitting element 6113 due to the variation of characteristics of the TFT 6125. Note that a channel length $L_1$ and a channel width $W_1$ of the TFT 6125, and a channel length $L_2$ and a channel width $W_2$ of the TFT 6126 may be set to satisfy the equation of $L_1/W_1:L_2/W_2=5:1$ to 6000:1. Moreover, it is preferably in a viewpoint of manufacturing steps that both TFTs have the same conductivity type. Further, a depletion mode TFT may be used for the TFT 6125, in addition to an enhancement mode TFT.

Figure 16A:
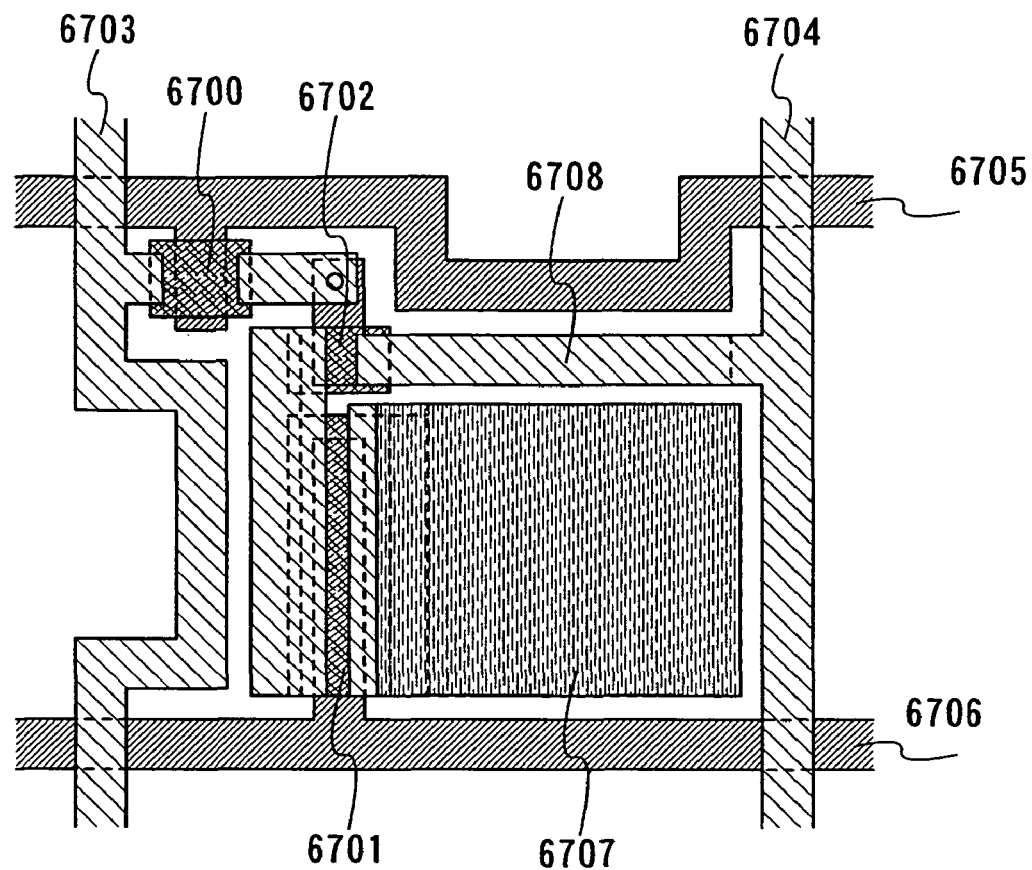
FIGS. 16A and 16B are a top view and a circuit diagram of a pixel circuit of a semiconductor device according to the present invention (Embodiment 3).
Figure 16B:
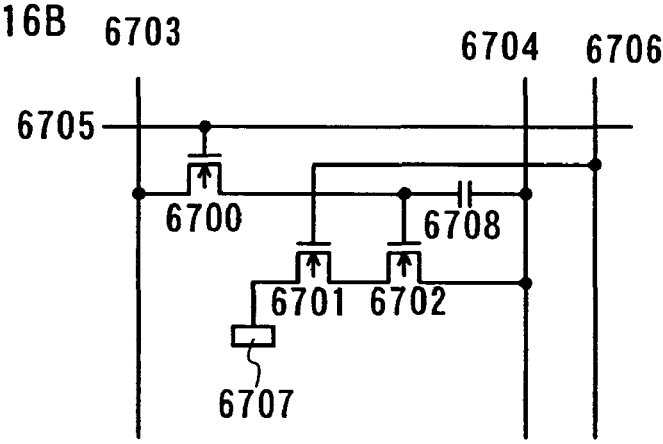

FIGS. 16A and 16B are a top view and a circuit diagram for the pixel circuit of the above-described structure. In the pixel circuit shown in FIGS. 16A and 16B, TFTs 6700, 6701, and 6702, and a capacitor element 6708 are provided in a region surrounded with a signal line 6703, a power supply line 6704, a scanning line 6705, and a power supply line 6706. In addition, a pixel electrode 6707 is connected to a source or a drain of the TFT 6701.

Note that either an analog video signal or a digital video signal may be used for the semiconductor device of the present invention having a display function. However, in the case where the digital video signal is used, the digital video signal has two types; either voltage or current is used for the video signal. Thus, a video signal inputted to the pixel in emitting the light emitting element comprises a video signal having constant voltage or a video signal having constant current. The video signal having constant voltage comprises a video signal having constant voltage applied to the light emitting element of a video signal having constant current that flows in the light emitting element. Moreover, the video signal having constant current comprises a video signal having constant voltage applied to the light emitting element or a video signal having constant current that flows to the light emitting element. The video signal having constant voltage applied to the light emitting element is called constant voltage drive, and the video signal having constant current that flows to the light emitting element is called constant current drive. As for the constant current drive, current flows constantly regardless of changes in resistance of the light emitting element. The display device and the method thereof according to the present invention may employ either video signal using voltage or video signal using current, or may employ either constant voltage drive or constant current drive. This embodiment can be freely combined with the above-described embodiment mode and embodiment.

Embodiment 4

Figure 15A:
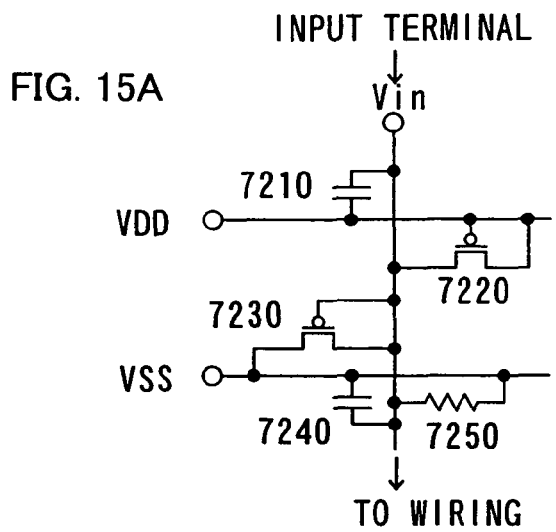
FIGS. 15A to 15E are diagrams showing a protection circuit provided for a semiconductor device according to the present invention (Embodiment 4).
Figure 15D:
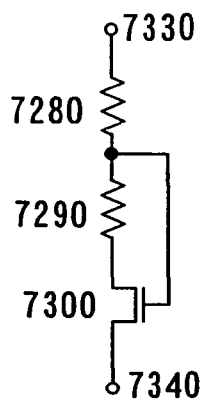

One example of a protection circuit provided for the semiconductor device of the present invention is described. A protection circuit is constituted by one or a plurality of elements selected from a TFT, a diode, a resistor, and a capacitor element, and the like. Hereinafter, several structures of the protection circuit and operation thereof are described. First, a structure of an equivalent circuit diagram of a protection circuit disposed between an external circuit and an internal circuit corresponding to one input terminal is described with reference to FIGS. 15A to 15E. A protection circuit shown in FIG. 15A comprises p-type TFTs 7220 and 7230, capacitor elements 7210 and 7240, and a resistor 7250. The resistor 7250 is a resistor for two terminals. Input voltage Vin (hereinafter, Vin) is applied to one terminal, and low potential voltage VSS (hereinafter, VSS) is applied to the other terminal. The resistor 7250 is provided in order that an electric potential of the wiring is decreased to VSS in the case where Vin is not supplied to an input terminal. The resistance value of the resistor is set to be sufficiently higher than a wiring resistance of the wiring.

In the case where Vin is higher than high potential voltage VDD (hereinafter, VDD), a TFT 7220 turns ON and a TFT 7230 turns OFF according to the relation of gate-source voltage. Then, VDD is applied to the wiring via the TFT 7220. Therefore, voltage applied to the wiring does not become higher than VDD even if Vin becomes higher than VDD due to noise and the like. On the other hand, in the case where Vin is lower than VSS, the TFT 7220 turns OFF and the TFT 7230 turns ON according to the relation of gate-source voltage. Then, VSS is applied to the wiring. Therefore, voltage applied to the wiring does not become lower than VSS even if Vin becomes lower than VSS due to noise and the like. Moreover, voltage from the input terminal can be dulled to pulsed noise to be able to lower steep change of voltage due to noise to some extent by capacitor elements 7210 and 7240.

According to the arrangement of the protection circuit of the above-described structure, the voltage of the wiring is kept between VSS and VDD and is protected from extraordinarily high or low voltage outside this range. Moreover, the protection circuit is provided for the input terminal to which signal is inputted. Accordingly, all of voltage of the wiring to which signal can be inputted can be kept to a certain height (here, a height of VSS) when signal is not inputted. Thus, the protection circuit also serves as a short ring that can make wirings be short-circuited when signal is not inputted. Therefore, electrostatic discharge damage due to voltage difference between the wirings can be prevented. Furthermore, signal inputted to the wiring is not pulled by VSS since the resistance value of a resistor 7250 is sufficiently high when signal is inputted.

Figure 15B:
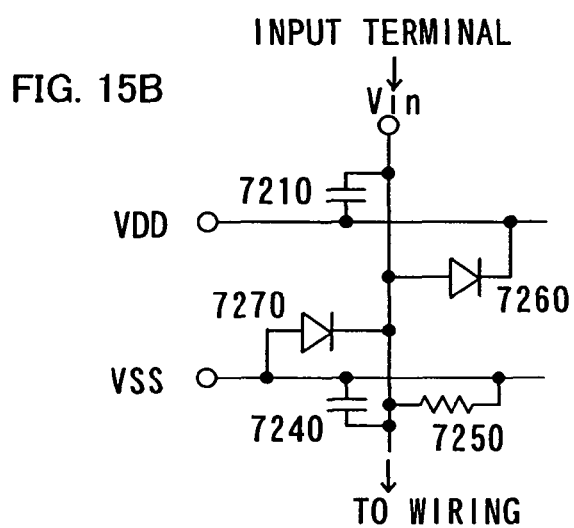
Figure 15E:
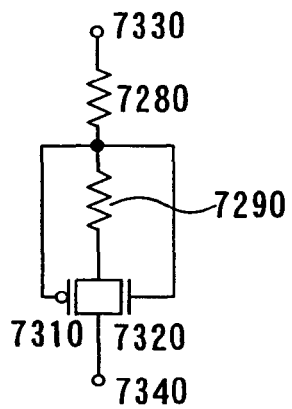
Figure 15C:
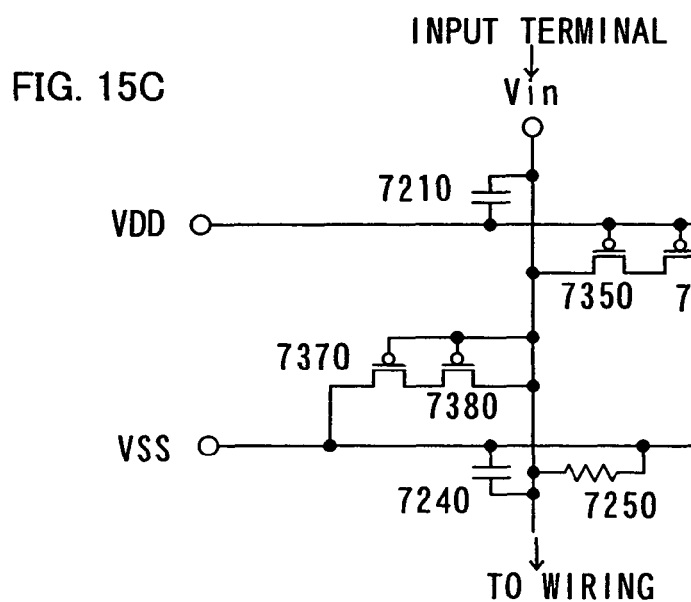

FIG. 15B shows an equivalent circuit diagram of a protection circuit in which diodes 7260 and 7270 having rectification are used instead of p-type TFTs 7220 and 7230. FIG. 15C shows an equivalent circuit diagram of a protection circuit in which TFTs 7350, 7360, 7370, and 7380 are used instead of p-type TFTs 7220 and 7230. Moreover, a protection circuit shown in FIG. 15D, which is a protection circuit having a different structure from the above, comprises resistors 7280 and 7290 and a transistor 7300. A protection circuit shown in FIG. 15E comprises resistors 7280 and 7290, a p-type TFT 7310, and an n-type TFT 7320. In both structures of FIGS. 15D and 15E, a terminal 7330 is connected to a wiring and the like, and in the case where electric potential of the wiring and the like rapidly changes, current flows in the direction from the terminal 7330 to a terminal 7340 by turning an n-type TFT 7300 or p-type TFT's 7310 and 7320 ON. Then, rapid change of electric potential connected to the terminal 7330 is alleviated, so that an element can be prevented from being damaged or destroyed. Note that an element that constitutes the above-mentioned protection circuit is preferably to be structured by an amorphous semiconductor that is superior in withstanding pressure. This embodiment can be freely combined with the above-described embodiment mode.

Embodiment 5

According to the present invention, various kinds of semiconductor devices can be manufactured. Thus, the present invention can be applied to various kinds of electric appliances by incorporating the semiconductor devices in a display portion.

Such electric appliances includes a video camera, a digital camera, a projector, a head mounted display (a goggle type display), a car navigation system, a car stereo, a personal computer, a gaming machine, a personal digital assistant (a portable information terminal, a mobile computer, a cellular phone, an electronic book, and the like), an image reproducing device provided with recording medium (typically, a device provided with a display that can reproduce a recording medium such as DVD (digital versatile disc) and display the image), and the like. Examples of the electric appliances are shown in FIGS. 10A to 10E.

FIG. 10A shows a TV set. A display panel 2002 manufactured by using a liquid crystal or an EL element is incorporated in a case 2001. By means of a receiving set 2005, general television broadcasting can be received, and further, one-way (from a transmitter to a receiver) information and communication or two-way (from a transmitter to a receiver, or between receivers) information and communication can be conducted by being connected to a wired or wireless communication network via a modem 2004. The TV set can be operated by a switch incorporated in the frame or a remote control unit 2006 provided separately, and the remote control unit may be provided with a display portion 2007 that shows information to be outputted.

Moreover, the television set also may be provided with a sub display 2008 formed by a second display panel in addition to a main display 2003, and may be provided with a structure for showing conditions of a channel and sound volume and the like. In this structure, the main display 2003 may be formed by an EL display panel that is superior in a viewing angle, and the sub display may be formed by a liquid crystal display panel that can be shown in low power consumption. Moreover, in order to give priority to low power consumption, the main display 2003 may be formed by a liquid crystal display panel, the sub display may be formed by an EL display panel and have a structure that can flash. According to the present invention, a semiconductor device having high reliability can be formed, even if a number of TFTs and electronic components are used in such a large substrate.

FIG. 10B shows a note-type computer, and it comprises a main body 2101, a case 2102, a display portion 2103, a keyboard 2104, an external connection port 2105, and a pointing mouse 2106, and the like. The present invention is applied to manufacturing the display portion 2103. According to the present invention, an image having high reliability and high image quality can be displayed even if a note-type computer is downsized and a wiring and the like are refined.

FIG. 10C shows an image reproducing device provided with recording medium (typically, a DVD reproducing device). The image reproducing device comprises a main body 2201, a case 2202, a display portion A 2203, a display portion B 2204, a recording medium (such as DVD) reading portion 2205, operation switches 2206, and a speaker portion 2207, and the like. The display portion A 2203 mainly displays image information, and the display portion B 2204 mainly displays textual information. The present invention is applied to manufacturing the display portions A 2203 and B 2204. According to the present invention, an image having high reliability and high image quality can be displayed even if an image reproducing device is downsized and a wiring and the like are refined.

FIG. 10D shows a cellular phone. The cellular phone comprises a main body 2301, an audio input portion 2302, an audio output portion 2303, a display portion 2304, operation switches 2305, an antenna 2306, and the like. By applying a semiconductor device manufactured according to the present invention to the display portion 2304, an image having high reliability and high image quality can be displayed even if a cellular phone is downsized and a wiring and the like are refined.

FIG. 10E shows a video camera. The video camera comprises a main body 2401, a display portion 2402, a case 2403, an external connection port 2404, a remote control receiving portion 2405, an image receiving portion 2406, a battery 2407, an audio input portion 2408, operation switches 2409, an eyepiece unit 2410, and the like. By applying a semiconductor device manufactured according to the present invention to the display portion 2402, an image having high reliability and high image quality can be displayed even if a video camera is downsized and a wiring and the like are refined. This embodiment can be freely combined with the above-described embodiment mode and embodiment.

This application is based on Japanese Patent Application serial no. 2003-367163 filed in Japan Patent Office on Oct. 28, 2003, the contents of which are hereby incorporated by reference.

What is claimed is:

1. A semiconductor device comprising:
   a first conductive layer over an insulating substrate;
   an insulating layer over the first conductive layer;
   a porous film over the insulating layer, wherein the insulating layer and the porous film have an opening that reaches the first conductive layer; and
   a second conductive layer on and in contact with the porous film, wherein said second conductive layer is connected to the first conductive layer through the opening,
   wherein an outermost side end portion of the second conductive layer is aligned with a side end portion of the porous film, and
   wherein an entire top surface of the porous film is overlapped with the second conductive layer.

2. The semiconductor device according to claim 1, wherein the porous film has pores; wherein the second conductive layer is formed by a conductive material; and wherein at least one pore is filled with the conductive material.

3. The semiconductor device according to claim 1, wherein the porous film comprises a material selected from the group consisting of an organic material, a porous material having a skeleton by a bond of silicon and oxygen, a porous organic resin material, and a porous silica material.

4. The semiconductor device according to claim 1, wherein at least one of the first conductive layer and the second conductive layer comprises one of Ag, Au, Cu, and indium tin oxide.

5. The semiconductor device according to claim 1, wherein the semiconductor device is one selected from the group consisting of a camera, a personal digital assistant, a personal computer, a cellular phone, and a television set.

6. The semiconductor device according to claim 1, wherein the insulating layer is capable to flatten an irregularity caused by the first conductive layer.

\* \* \* \* \*